US011100441B2

(12) United States Patent
Nonoyama

(10) Patent No.: US 11,100,441 B2
(45) Date of Patent: Aug. 24, 2021

(54) MANAGEMENT DEVICE

(71) Applicant: FUJI CORPORATION, Chiryu (JP)

(72) Inventor: Kazushi Nonoyama, Toyota (JP)

(73) Assignee: FUJI CORPORATION, Chiryu (JP)

( * ) Notice: Subject to any disclaimer, the term of this patent is extended or adjusted under 35 U.S.C. 154(b) by 582 days.

(21) Appl. No.: 15/306,673

(22) PCT Filed: Apr. 28, 2014

(86) PCT No.: PCT/JP2014/061895
§ 371 (c)(1),
(2) Date: Oct. 25, 2016

(87) PCT Pub. No.: WO2015/166538
PCT Pub. Date: Nov. 5, 2015

(65) Prior Publication Data
US 2017/0061365 A1    Mar. 2, 2017

(51) Int. Cl.
*G06Q 10/06*    (2012.01)
*G06Q 50/04*    (2012.01)
(Continued)

(52) U.S. Cl.
CPC ..... *G06Q 10/06316* (2013.01); *G05B 19/418* (2013.01); *G06Q 10/06311* (2013.01);
(Continued)

(58) Field of Classification Search
CPC ....... G06Q 10/06316; G06Q 10/06311; G06Q 10/063118; G06Q 50/04; G05B 19/418; H05K 13/02
(Continued)

(56) References Cited

U.S. PATENT DOCUMENTS 5,093,794 A * 3/1992 Howie .................. G06Q 10/06
700/100
5,155,679 A * 10/1992 Jain .................. G05B 19/41865
700/106
(Continued)

FOREIGN PATENT DOCUMENTS

JP    2005/009101 A1    1/2005
JP    2006-237566 A    9/2006
(Continued)

OTHER PUBLICATIONS

Machine Translation of JP2018201021A, 2018 Document Actions (Year: 2018).*
(Continued)

*Primary Examiner* — Charles Guiliano
(74) *Attorney, Agent, or Firm* — Oblon, McClelland, Maier & Neustadt, L.L.P.

(57) ABSTRACT

An automatic splicing unit (ASU) is arranged in a production line configured to include multiple mounters. When an operator performs splicing work of each mounter by using the ASU, each time a component shortage is predicted, a priority is determined so as to perform the splicing work giving priority to those for which a distance to the ASU is shorter from multiple work target mounters having a mounted feeder which has not completed the splicing work yet (S106 to S116). In this manner, it is possible to minimize the movement of the ASU when splicing work is performed for all of the work target mounters, and it is possible to quickly and efficiently perform splicing work.

13 Claims, 15 Drawing Sheets

(51) Int. Cl.
*G05B 19/418* (2006.01)
*H05K 13/02* (2006.01)

(52) U.S. Cl.
CPC ..... *G06Q 10/063118* (2013.01); *G06Q 50/04* (2013.01); *H05K 13/02* (2013.01)

(58) Field of Classification Search
USPC .................................................. 705/7.26, 7.17
See application file for complete search history.

(56) References Cited

U.S. PATENT DOCUMENTS

| | | | | |
|---|---|---|---|---|
| 5,321,885 | A * | 6/1994 | Hino | B23P 21/004 29/832 |
| 2002/0188489 | A1 * | 12/2002 | Cheng | G06Q 10/04 705/7.26 |
| 2005/0149217 | A1 * | 7/2005 | Okada | G06Q 10/06 700/96 |
| 2006/0200264 | A1 * | 9/2006 | Kodama | G06Q 10/087 700/121 |
| 2008/0140246 | A1 * | 6/2008 | Kang | G05B 19/41815 700/109 |
| 2008/0162242 | A1 | 7/2008 | Schneur et al. | |
| 2010/0079259 | A1 * | 4/2010 | Inagaki | G06K 7/0008 340/10.41 |
| 2013/0054005 | A1 * | 2/2013 | Stevens | B65G 1/1373 700/216 |

FOREIGN PATENT DOCUMENTS

| | | |
|---|---|---|
| JP | 2008-311393 A | 12/2008 |
| JP | 2010-186318 A | 8/2010 |
| JP | 2018201021 A * | 12/2018 ........... G05B 19/418 |

OTHER PUBLICATIONS

Kong, et al., Printed Circuit Board Assemble Process Decision-Making System Based on Knowledge, 37-38 Applied Mechanics and Materials 899 (2010) (Year: 2010).*
Japanese Office Action dated Feb. 6, 2018 in Patent Application No. 2016-515786 (with English translation), 6 pages.
Japanese Office Action dated Jul. 2, 2019 in Patent Application No. 2018-128025.
International Search Report dated Jul. 29, 2014 in PCT/JP2014/061895 filed Apr. 28, 2014.
Extended European Search Report dated Jan. 9, 2018 in Patent Application No. 14891055.7, 8 pages.

* cited by examiner

| Operator | Work target | Work contents | Standard required time | Component shortage prediction time |
|---|---|---|---|---|
| A | Printer | Solder replenishment | 40 seconds | 14:01:30 |
| B | Mounter 09 | Splicing work | 30 seconds | 14:02:00 |
| A | Mounter 03 | Splicing work | 30 seconds | 14:07:00 |
| B | Mounter 05 | Splicing work | 30 seconds | 14:07:00 |
| A | Printer | Solder replenishment | 40 seconds | 14:10:00 |
| A | Mounter 01 | Splicing work | 30 seconds | 14:11:00 |

MANAGEMENT DEVICE

TECHNICAL FIELD

The present application relates to a management device that manages predetermined work to be performed by an operator using a predetermined work unit for multiple board processing machines which perform a predetermined process on a circuit board.

BACKGROUND ART

In the related art, as this type of management device, a management device has been proposed which, for a board production line with multiple component mounting machines, in a case where multiple warnings such as a component shortage notice are issued, prompts an operator to perform work according to a determined priority order that is determined giving priority to warnings which have a higher possibility that an operator is near to the position where the warning occurred (for example, refer to PTL 1). Specifically, this device determines the priority order so as to give a higher priority to a warning with a position which is closer to the position of the warning that was handled immediately before.
PTL 1: JP-A-2008-311393

SUMMARY

Work to be performed by an operator for a board processing machine such as a component mounting machine includes work which does not need a special work unit, for example, suction nozzle exchange and defective board removal, and work which needs a special work unit, for example, using an automatic splicing unit (ASU) to perform splicing work for joining the leading end of a new component tape to the tail end of a component tape for which the components will soon be used up or exchanging a feeder for which the components will soon be used up for a new feeder. In the latter work, an operator needs to pick up the work unit (ASU or new feeder) and to deliver the work unit to a work target. If the priority order (work sequence) is determined according to only the position of the warning (position of the work target board processing machine) as in the above-described management device, work efficiency cannot be sufficiently improved.

A main object of the disclosure is to improve the work efficiency of work performed by an operator using a work unit for multiple board processing machines which perform a predetermined process on a circuit board.

The disclosure adopts the following form in order to achieve the above-described main object.

A gist of a first management device according to the disclosure is that the device manages a predetermined work to be performed by an operator using a predetermined work unit for multiple board processing machines which perform a predetermined process on a circuit board, and the management device includes a work information acquisition device for acquiring at least a work target from the multiple board processing machines and a work period by which time the predetermined work is required for the work target, as work information, a position acquisition device for acquiring a current position of the work unit, a work sequence determination device for, in a case where the work information acquisition device acquires multiple pieces of the work information, determining a work sequence for multiple work targets based on the current position of the work unit acquired by the position acquisition device, within a range where the predetermined work can be performed before elapse of the work periods respectively corresponding to the multiple work targets relating to the multiple acquired pieces of the work information, and a work instruction device for instructing the operator to perform the predetermined work based on the determined work sequence.

In this first management device according to the disclosure, at least the work target from the multiple board processing machines or the work period by which time the predetermined work is required for the work target are acquired as the work information; the current position of the work unit is acquired; in a case where multiple pieces of the work information are acquired, the work sequence is determined for the multiple work targets based on the acquired current position of the work unit, within the range where the predetermined work can be performed on or before elapse of the work periods respectively corresponding to the multiple work targets relating to the multiple acquired pieces of the work information; then, based on the determined work sequence, the operator is instructed to perform the predetermined work. In this manner, the work sequence is determined considering labor required for the operator to pick up the work unit and to deliver the work unit to the work target, thus it is possible to improve overall work efficiency.

In this first management device according to the disclosure, the work sequence determination device may determine the work sequence so that the predetermined work is performed giving priority to, from the multiple work targets, work targets closer to the acquired current position of the work unit. The first management device according to this aspect of the disclosure may further include a storage device that stores a work history for the multiple board processing machines. The position acquisition device may estimate the current position of the work unit by acquiring information relating to the board processing machine which has performed the predetermined work immediately before, based on the stored work history. In this case, it is not necessary to provide a dedicated position detection device in order to acquire the current position of the work unit.

In addition, in the first management device according to the disclosure, the position acquisition device may acquire a current position of an operator. The work sequence determination device may determine the work sequence so that the predetermined work is performed by giving a priority to, from the multiple work targets, work targets for which a sum of the distance from the acquired current position of the operator to the acquired current position of the work unit and the distance from the current position of the work unit to the position of the work target is smaller. In this case, the work sequence can be determined so as to shorten an operation route of the operator considering the current position of the work unit. Accordingly, it is possible to improve work efficiency.

Furthermore, in the first management device according to the disclosure, multiple of the work units may be provided; the position acquisition device may acquire the current position of each of the multiple work units; the work sequence determination device may determine the work sequence, based on the current position of the work unit, from the multiple work units, for which the distance to the work target is shortest. In this case, even in a case where the multiple work units are provided, it is possible to improve work efficiency.

A gist of a second management device according to the disclosure is that the device manages a predetermined work to be performed by an operator using a work unit accommodated at a predetermined accommodation position for multiple board processing machines which perform a predetermined process on a circuit board, and the management device includes a work information acquisition device for acquiring at least a work target from the multiple board processing machines or a work period by which time the predetermined work is required for the work target, as work information, a position acquisition device for acquiring a current position for each of multiple operators, an operator determination device for determining, from the multiple workers, the operator who can perform the predetermined work before elapse of the work period corresponding to the work target relating to the acquired work information and for which a distance from the current position acquired by the position acquisition device to the predetermined accommodation position is shortest as the operator who performs the predetermined work, in a case where the work information acquisition device acquires the work information, and a work instruction device for instructing the determined worker to perform the predetermined work.

In this second management device according to the disclosure, at least the work target from the multiple board processing machines or the work period by which time the predetermined work is required for the work target are acquired as the work information; the current position of each of the multiple workers is acquired; and in a case where the work information is acquired, from the multiple workers, the operator who can perform the predetermined work on or before elapse of the work period corresponding to the work target relating to the acquired work information and for which the distance from the acquired current position to the accommodation position for accommodating the work unit is shortest is determined as the operator who performs the predetermined work; and the determined worker is instructed to perform the predetermined work. In this manner, the operator suitable for the work is determined considering labor required for the operator to pick up the work unit and to deliver the work unit to the work target. Accordingly, it is possible to improve work efficiency.

This second management device according to the present disclosure may further include a storage device for storing a work history of each of the multiple workers. The position acquisition device estimates the current position of each of the multiple workers by acquiring information relating to the board processing machine at which the multiple workers respectively performed the predetermined work immediately before, based on the stored work history. In this case, it is not necessary to provide a dedicated position detection device in order to acquire the current position of the operator.

DESCRIPTION OF EMBODIMENTS

Next, an embodiment of the disclosure will be described.

Figure 1:
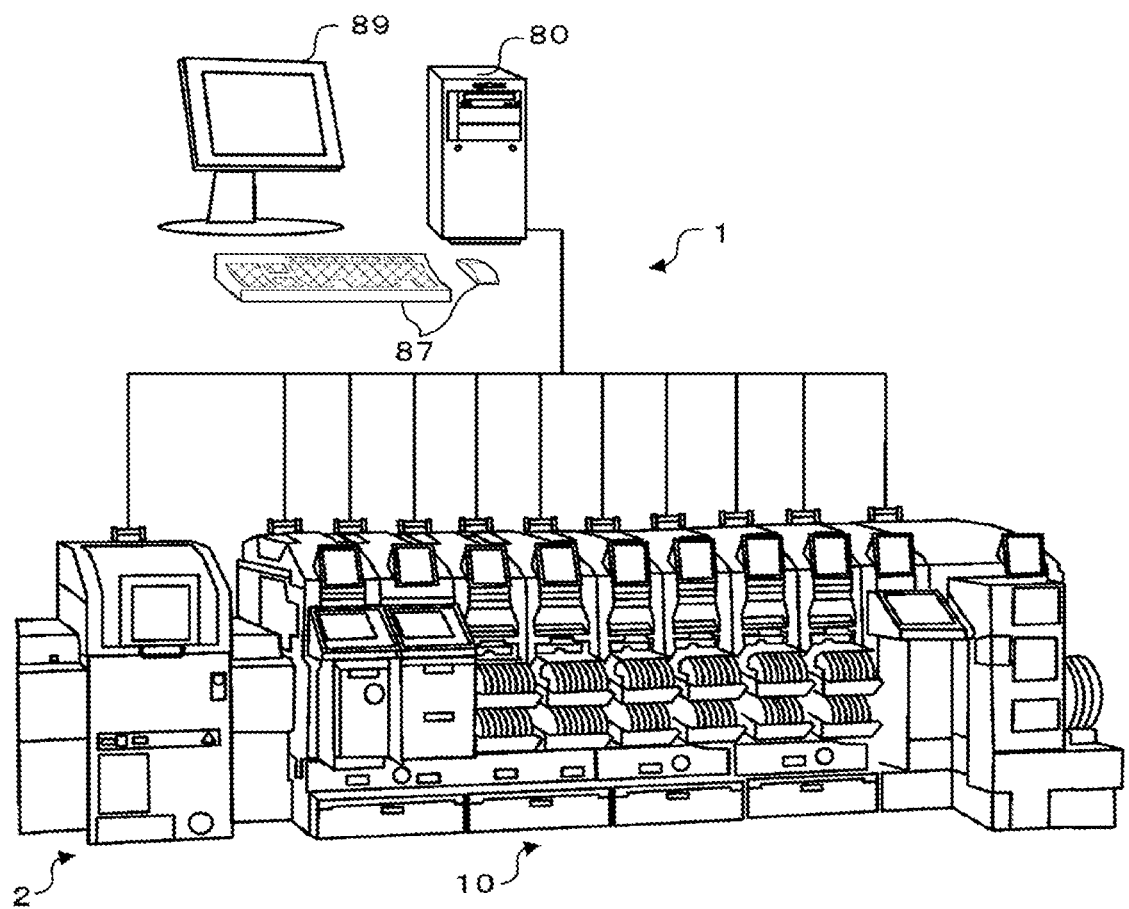
FIG. 1 is a configuration diagram illustrating a schematic configuration of component mounting system 1.
Figure 2:
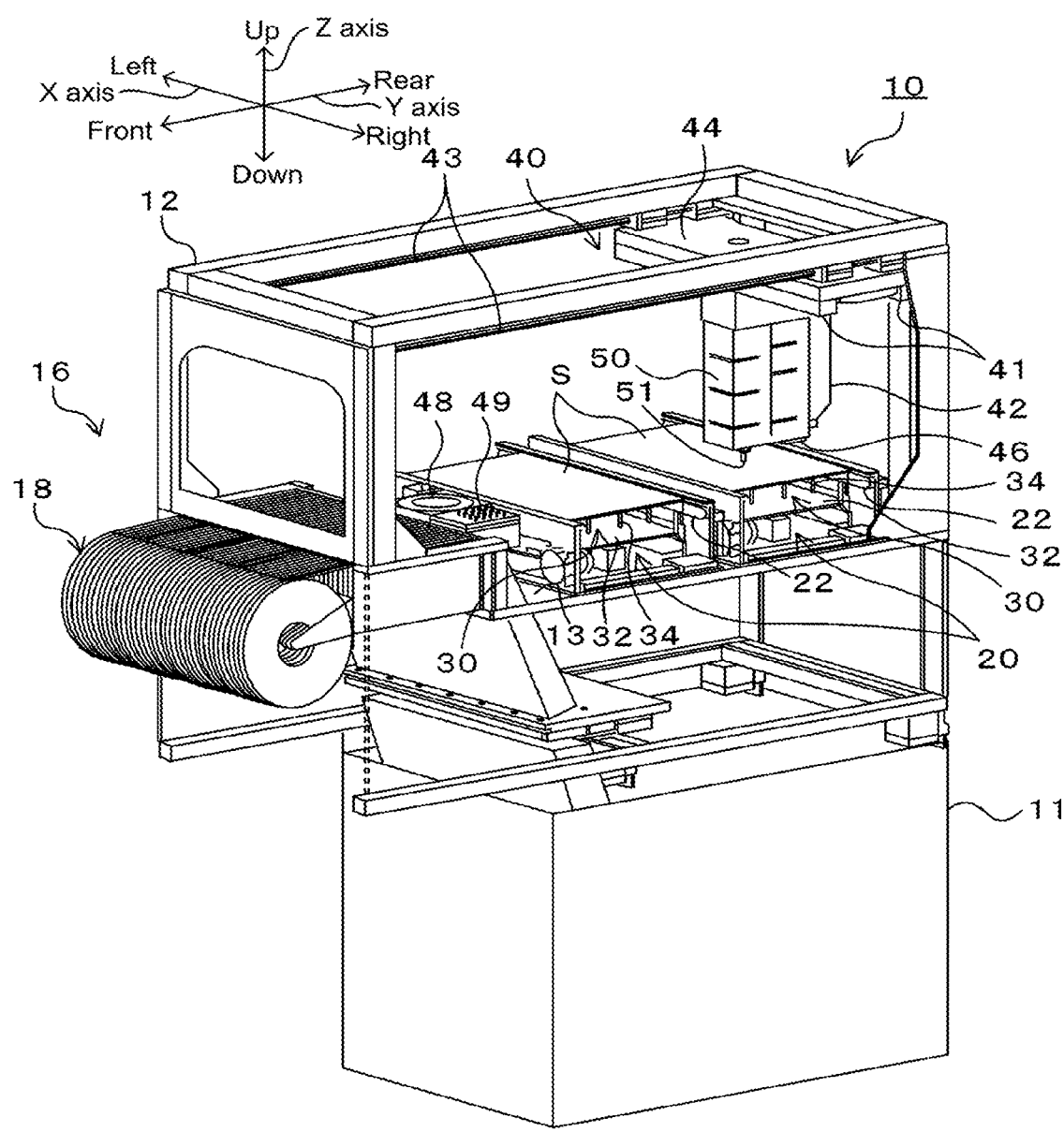
FIG. 2 is a configuration diagram illustrating a schematic configuration of component mounting machine 10.
Figure 3:
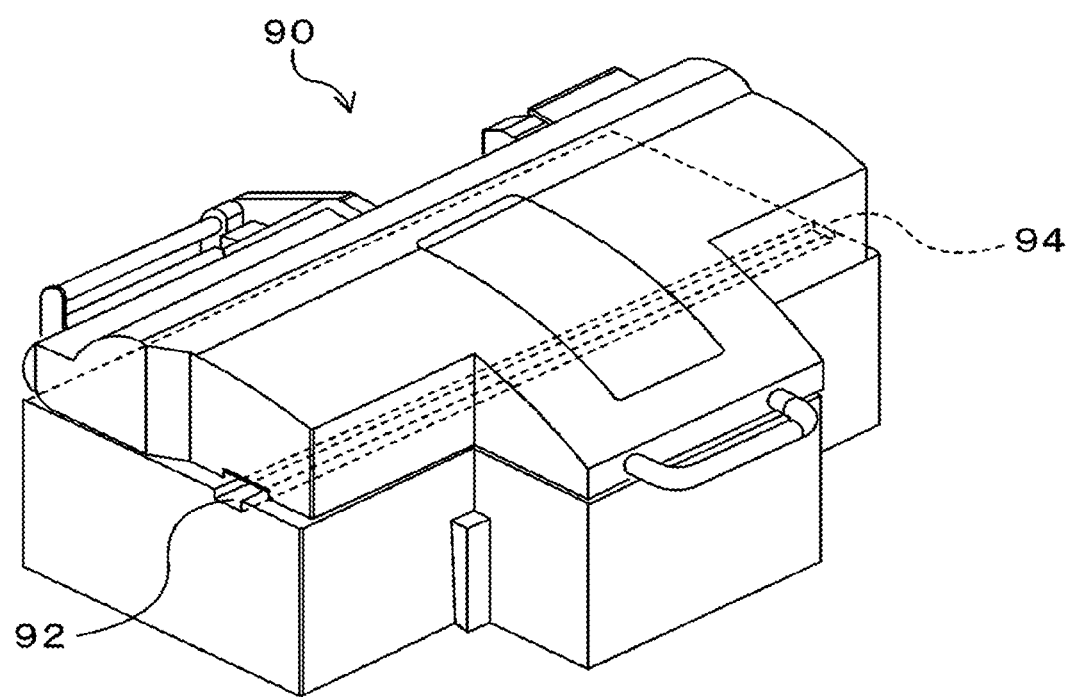
FIG. 3 is an external view illustrating an external configuration of automatic splicing unit (ASU) 90.
Figure 4:
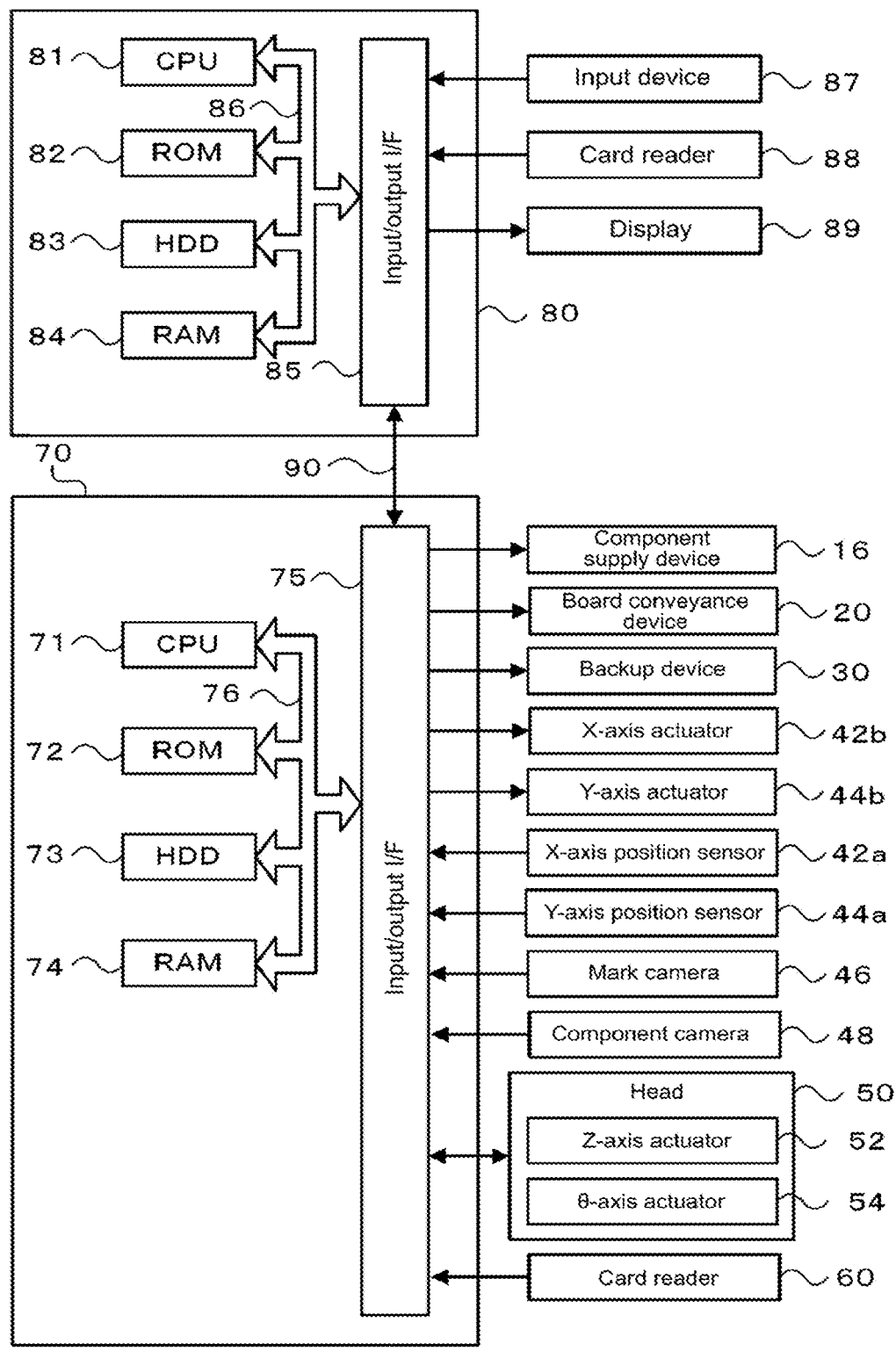
FIG. 4 is a block diagram illustrating an electrical connection relationship between control device 70 and management device 80 in component mounting machine 10.

FIG. 1 is a configuration diagram illustrating a schematic configuration of component mounting system 1. FIG. 2 is a configuration diagram illustrating a schematic configuration of a single component mounting machine 10 configuring component mounting system 1. FIG. 3 is an external view illustrating an external configuration of automatic splicing unit (ASU) 90. FIG. 4 is a view for describing an electrical connection relationship between control device 70 and management device 80 in a single component mounting machine 10. In the present embodiment, a lateral direction in FIG. 2 represents the X-axis direction, a longitudinal direction represents the Y-axis direction, and a vertical direction represents the Z-axis direction.

As illustrated in FIG. 1, component mounting system 1 includes screen printer 2 that prints solder onto a circuit pattern on a circuit board S (hereinafter, simply referred to as a "board") via a pattern of holes formed in a screen by pushing solder into the pattern holes and rolling a squeegee on the screen, multiple (for example, ten) component mounting machines 10 that pick up an electronic component P (not illustrated) (hereinafter, simply referred to as a "component") supplied by component supply device 16 and mount the component on the circuit pattern of the board S, and management device 80 that manages the overall component mounting system.

The multiple component mounting machines 10 include those which have a head (multi-nozzle head) on which many suction nozzles can be mounted so as to rapidly mount components P having a relatively small size, and those which have a head (multi-function head) on which a few suction nozzles can be mounted so as to mount components P having a relatively large size or components P having an unusual shape, and components P are mounted onboard S with each mounting machine performing a portion of the work. As illustrated in FIG. 2, component mounting machine 10 includes component supply device 16 that supplies components P, board conveyance device 20 that conveys board S, backup device 30 that backs up board S conveyed by board conveyance device 20 from the underside, head 50 that causes suction nozzles 51 to pick up and mount components P on board S, XY robot 40 that moves head 50 in an XY direction, mark camera 46 that can image a positioning fiducial mark disposed in board S, component camera 48 that can image the component P held by suction nozzle 51, nozzle station 49 that stocks multiple suction nozzles 51, and control device 70 (refer to FIG. 4) that controls the overall component mounting machine. Board conveyance device 20, backup device 30, head 50, and XY robot 40 are accommodated inside main body frame 12 installed on base 11.

Component supply device 16 includes feeders 18 arranged on a feeder table (not illustrated) formed on a front surface of main body frame 12 so as to be lined up in the lateral direction (X-axis direction). Feeders 18 are tape feeders that feed carrier tape accommodating components P at a predetermined pitch to a component supply position where suction nozzle 51 can pick up the component. Although not illustrated, the carrier tape is configured to include a bottom tape having cavities (recessed sections) formed at a predetermined pitch and a top film covering the bottom tape in a state such that a component P is accommodated in each cavity. Feeder 18 pulls out carrier tape wound around a reel, feeds the carrier tape to the component supply position, and detaches the top film from the bottom tape in front of the component supply position, thereby bringing the component P into an exposed state, that is, a state available for pickup, at the component supply position.

As illustrated in FIG. 2, board conveyance device 20 is configured to function as a dual lane-type conveyance device having two board conveyance paths, and is arranged on support table 13 disposed in a middle stage of main body frame 12. Each board conveyance path includes belt conveyor device 22. Belt conveyor device 22 is driven, thereby conveying the board S from the left to the right (board conveyance direction) in FIG. 2.

Backup device 30 includes backup plate 32 installed so that backup plate 32 can be lifted and lowered by a lifting and lowering device (not illustrated) and multiple backup pins 34 that are erected on backup plate 32. Backup device 30 backs up the board S from the underside by lifting up backup plate 32 in a state with board S conveyed to above backup plate 32 by board conveyance device 20.

As illustrated in FIG. 2, XY robot 40 includes Y-axis guide rail 43 disposed along the Y-axis direction in an upper stage of main body frame 12, Y-axis slider 44 that is movable along Y-axis guide rail 43, X-axis guide rail 41 disposed along the X-axis direction on a lower surface of Y-axis slider 44, and X-axis slider 42 that is movable along X-axis guide rail 41. The above-described mark camera 46 is attached to the lower surface of X-axis slider 42. XY robot 40 is controlled and driven, thereby enabling mark camera 46 to image any desired position on a surface of the board S backed up by the backup device 30.

Control device 70 is configured to function as a microprocessor mainly having CPU 71, and includes ROM 72, HDD 73, RAM 74, and input and output interface 75 in addition to CPU 71. These are electrically connected to each other via bus 76. A position signal from X-axis position sensor 42*a* for detecting the position of X-axis slider 42, a position signal from Y-axis position sensor 44*a* for detecting the position of Y-axis slider 44, an image signal from mark camera 46, an image signal from component camera 48, and information read from card reader 60 are input to control device 70 via input and output interface 75. An operator possesses an IC card as an operator's ID; when the operator starts to perform work using screen printer 2 or any of the component mounting machines 10, the operator selects content of the work to be performed, and holds up the IC card over card reader 60. Control device 70 reads card information from card reader 60, thereby registering the operator's ID for identifying the operator and recognizing a work start time or a time spent for the work. On the other hand, control device 70 outputs a control signal to component supply device 16, a control signal to board conveyance device 20, a control signal to backup device 30, a drive signal to X-axis actuator 42*b* for moving X-axis slider 42, a drive signal to Y-axis actuator 44*b* for moving Y-axis slider 44, a drive signal to Z-axis actuator 52 for moving suction nozzle 51 in the Z-axis direction, and a drive signal to θ-axis actuator 54 for rotating suction nozzle 51, via input and output interface 75. In addition, control device 70 is connected to management device 80 so as to be capable of bidirectional communication, and both of these exchange data and control signals with each other.

For example, management device 80 is a general-purpose computer, and includes CPU 81, ROM 82, HDD 83, RAM 84, and input and output interface 85, and these are electrically connected to each other via a bus 86. An input signal is input to management device 80 from input device 87 such as a mouse or a keyboard via input and output interface 85. An image signal is input to display 89 from management device 80 via input and output interface 85. HDD 83 stores a production plan for the board S. Here, the production plan for the board S represents a plan for determining which board S needs the circuit pattern to be printed by screen printer 2, which components P are to be mounted on the board S in the respective component mounting machines 10 in any sequence, and how many sheets of the board S having the component P mounted thereon in that way are to be prepared. The production plan includes head information relating to heads 50 to be used, nozzle information relating to suction nozzles 51 to be used, component information relating to components P to be mounted, and feeder information relating to feeders 18 to be used. The production plan is input to management device 80 by the operator operating input device 87. Management device 80 outputs a command signal to screen printer 2 so as to print the circuit pattern on the board S in accordance with the production plan, and outputs a command signal to the respective component mounting machines 10 so as to mount components P on the circuit pattern of the board S. In addition, the respective component mounting machines 10 acquire the component information such as a type of the component P which can be supplied from feeders 18 mounted on the feeder table, the maximum number of the components P which can be supplied, and the number of the components P which are actually supplied together with a feeder ID (identification information), and transmit the information to management device 80. Management device 80 correlates the received component information with the feeder ID, stores (manages) the correlation for each of the component mounting machines 10, and predicts a component shortage time in each feeder 18 for each of the component mounting machines 10.

In addition, information read from card reader 88 is input to management device 80 via input and output interface 85. The operator holds their IC card (worker's ID) over card reader 88 when starting the work and when completing the work in the allocated line. Management device 80 reads card information from card reader 88, thereby constantly registering the operator's ID and the allocated line or cancelling the register. That is, even in a case where the operator is intermediately away from the allocated line or another worker is intermediately in charge of the line, management device 80 reads the card information from the IC card possessed by the operator, thereby managing the operator who is in charge of the current line. In addition, management device 80 communicates with a control device (not illustrated) of screen printer 2 or control device 70 of the respective component mounting machines 10, and performs management by acquiring a work history from control device 70, such as identification information of the operator (worker's ID) who performs the work at each line, a work target (whether the work is performed for any one of screen printer 2 and the multiple component mounting machines 10), work content, and a work completion time.

Automatic splicing unit (ASU) 90 is a device that automatically joins a tail end of the carrier tape wound around the reel mounted on feeder 18 to a leading end of the carrier tape wound around a new reel. The right and left portions of the ASU 90 have feeding grooves 92 and 94 that respectively feed the carrier tape toward the central portion. In addition, the central portion of the ASU 90 has a bonding device (not illustrated) that bonds a splicing tape to two carrier tapes fed along feeding grooves 92 and 94 so as to bond both of these to each other. In addition, feeding grooves 92 and 94 respectively have a cutting device (not illustrated) which cuts the carrier tapes fed into feeding grooves 92 and 94. When the two carrier tapes to be joined by the operator are respectively fed into feeding grooves 92 and 94, ASU 90 causes the cutting device to cut an unnecessary portion of the two carrier tapes, and causes the bonding device to bond the carrier tapes to each other by matching mutual cut surfaces. In a case where the operator carries out the splicing work by using ASU 90, a standard work time shows approximately 30 seconds. The ASU 90 is placed on a wheeled table (not illustrated), and is movable through the respective component mounting machines 10 in the mounting line.

Figure 5:
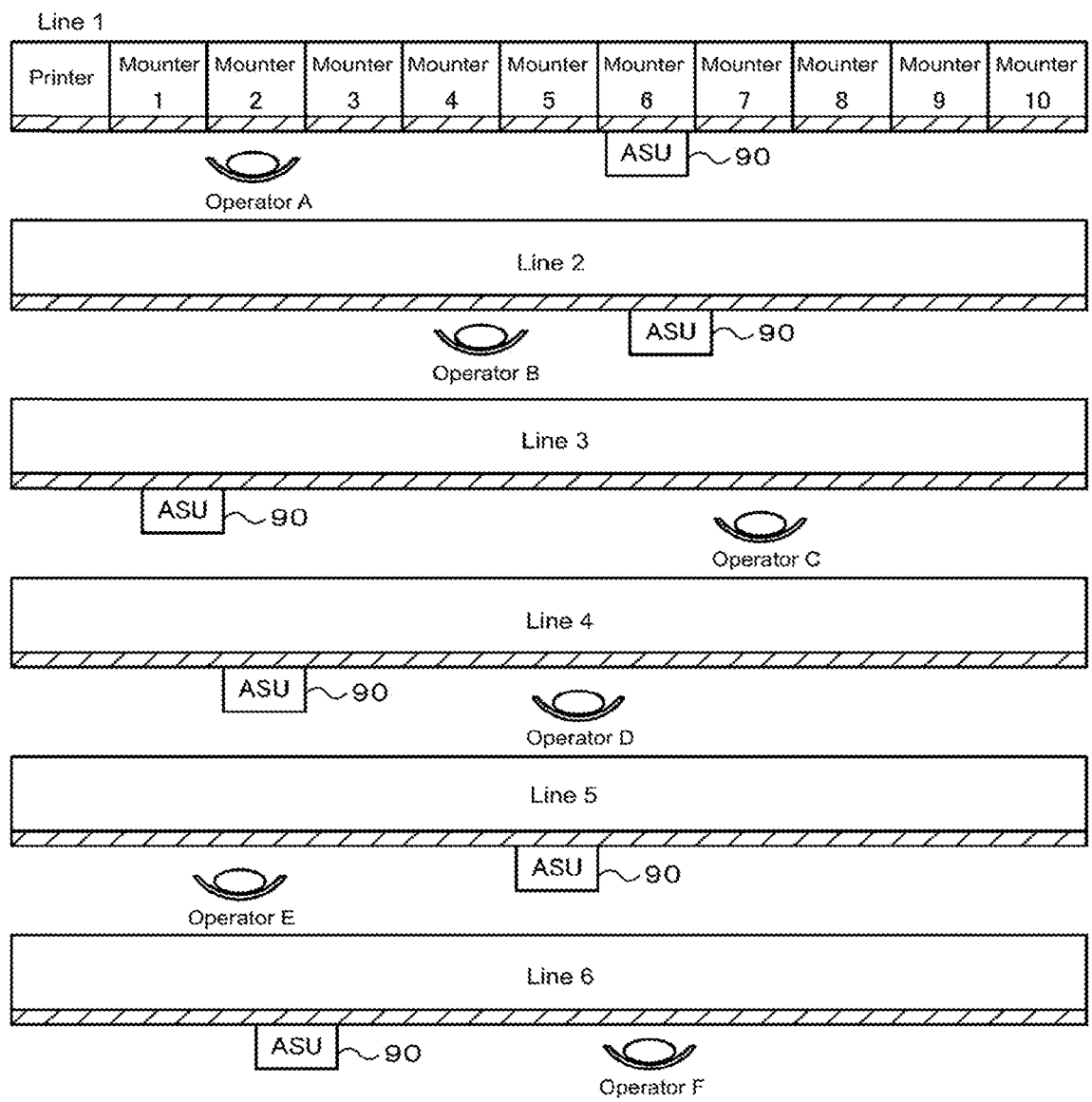
FIG. 5 is a view for describing an example of a production line.

FIG. 5 is a view for describing an example of a production line. As illustrated in FIG. 5, the production line has multiple (six) lines 1 to 6 arrayed therein, and the respective lines are configured to include the screen printer and ten component mounting machines 10 (also referred to as mounters 1 to 10). The respective lines 1 to 6 are respectively allocated to workers A to F who are in charge. In screen printer 2, the respective workers A to F perform solder replenishment work or screen exchange work. In the respective mounters 1 to 10, the respective workers A to F perform exchange work of feeders 18, splicing work using ASU 90, exchange work of heads 50, exchange work of suction nozzles 51 to be accommodated in nozzle station 49, and collection work of waste tape discharged from feeders 18 due to the supply of the component.

Figure 6:
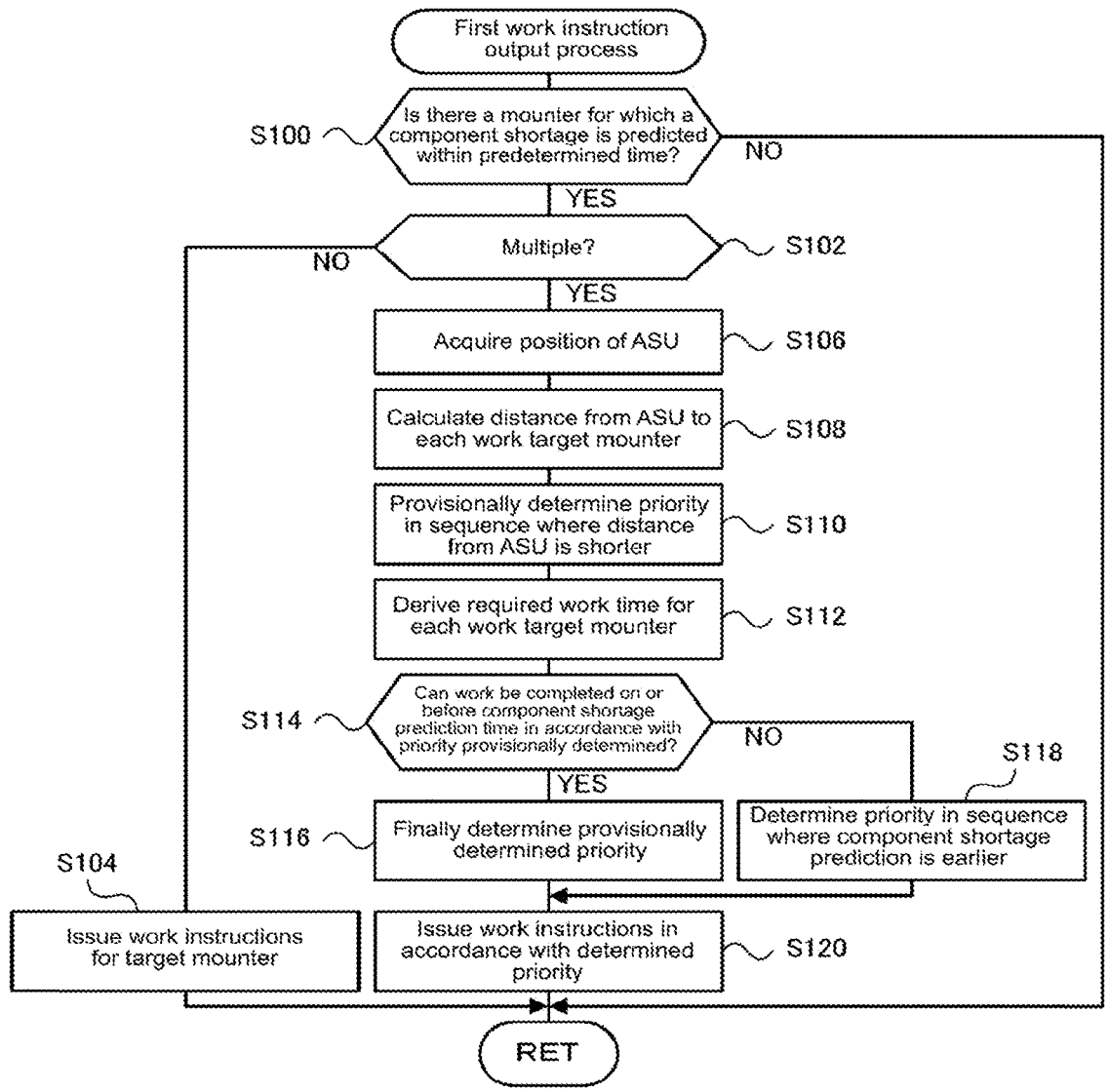
FIG. 6 is a flowchart illustrating an example of a first work instruction output process.

Next, for management device 80 configured in this way, a management process when an operator is instructed to perform the splicing work will be described. FIG. 6 is a flowchart illustrating an example of a first work instruction output process performed by CPU 81 of management device 80. According to the present embodiment, the production line has multiple lines (lines 1 to 6). Accordingly, the first work instruction output process is performed in each line.

If the first work instruction output process is performed, CPU 81 of management device 80 first determines whether there is a feeder 18 for which a component shortage is predicted within a predetermined time (for example, within 10 minutes) (Step S100). If CPU 81 determines that there is no feeder 18 in which a component shortage is predicted within the predetermined time, CPU 81 completes the first work instruction output process without issuing instructions for splicing work. On the other hand, if CPU 81 determines that there is a feeder 18 for which a component shortage is predicted within the predetermined time, CPU 81 determines whether there are multiple mounters having the feeder 18 mounted thereon (Step S102). If CPU 81 determines that there is only one mounter having the mounted feeder 18 for which the component shortage is predicted, CPU 81 instructs the operator to perform the splicing work for the mounter having the mounted feeder 18 which is regarded as a work target mounter (Step S104), and completes the first work instruction output process. The splicing work instruction can be issued by notifying the operator who has to perform the work, a working position (mounter number), or working content (splicing work) on display 89, or by notifying the information through a portable information terminal possessed by the operator. On the other hand, if CPU 81 determines that there are multiple mounters having the mounted feeder 18 for which a component shortage is predicted, CPU 81 acquires a current position of ASU 90 (Step S106), and considers the multiple mounters having the mounted feeder 18 for which the component shortage is predicted as work target mounters. Based on the acquired current position of ASU 90, CPU 81 calculates a distance from ASU 90 to the work target mounter for every work target mounter (Step S108). Here, in the process in Step S108, the current position may be acquired by using a known positioning system such as a GPS in ASU 90. Alternatively, whenever splicing work is performed, a work history may be acquired from the respective component mounting machines 10 (mounters 1 to 10), and may be stored in HDD 83. In this manner, the current position of ASU 90 may be estimated based on information (mounter number) relating to the mounter at which ASU 90 was used for the splicing work performed immediately previously.

If CPU 81 calculates the distance from ASU 90 to the work target mounter for every work target mounter in this way, CPU 81 provisionally determines a priority so that the splicing work is performed giving priority to, from the multiple work target mounters (Step S110), the work target mounter for which the distance from ASU 90 is shorter, and derives a required work time for each of the multiple work target mounters (Step S112). Here, the required work time can be calculated using a sum of a movement time during which the operator goes to, picks up, and delivers ASU 90 (moves) to the work target mounter and a standard work time (for example, 30 seconds) needed to perform the splicing work at the work target mounter by using ASU 90. The movement time can be calculated using a sum of a time until the operator goes to and picks up ASU 90 and a time until the operator delivers ASU 90 to the work target mounter. The former movement time can be calculated by setting a predetermined time, and the latter movement time can be calculated in such a way that the distance from ASU 90 to the work target mounter which is calculated in Step S108 is divided by a predetermined movement speed of ASU 90. The former movement time may be calculated in such a way that the current position of the operator is acquired, the distance from the operator to ASU 90 is calculated, and the distance from the operator to ASU 90 is divided by the predetermined standard movement speed (standard walking speed).

Then, in a case where CPU 81 provisionally determines to perform the splicing work in accordance with the priority which is provisionally determined in Step S110, CPU 81 determines whether the splicing work can be completed on or before each component shortage prediction time for all of the splicing works (Step S114). This process can be performed by determining that the splicing work can be completed with regard to the splicing work in which a remaining time from the current time to the component shortage prediction time is equal to or longer than the required work time derived in Step S112, or by determining that the splicing work cannot be completed with regard to the splicing work in which the remaining time from the current time to the component shortage prediction time is shorter than the required work time. In addition, in the process in Step S114, with regard to the first priority splicing work, if the remaining time from the current time to the component shortage prediction time is equal to or longer than the required work time derived in Step S112, it is determined that the splicing work can be completed for the first priority splicing work; next, with regard to the second priority splicing work, if the remaining time from a time obtained by adding the required work time of the first priority splicing work to the current time to the component shortage prediction time is equal to or longer than the required work time derived by considering the position of the first priority work target mounter as the position of the ASU, it is determined that the splicing work can be completed for the second priority splicing work; thus, determination is performed considering a result of the splicing work that has a higher priority.

If CPU 81 determines that the splicing work can be completed on or before each component shortage prediction time for all of the splicing works, CPU 81 finally determines the priority provisionally determined in Step S110 (Step S116), instructs the operator to perform the splicing work (Step S120), and completes the work instruction output process. For example, the process in Step S120 can be performed by notifying the work priority, the working position (mounter number), or the working content (splicing work) on display 89, or by notifying the information through a portable information terminal possessed by the operator. The work priority includes which worker has to perform the work and where ASU 90 is currently located. On the other hand, if CPU 81 determines that the splicing work cannot be completed on or before the component shortage prediction time for any one of the multiple splicing works, CPU 81 re-determines the priority so as to give priority to the splicing work for which the component shortage prediction time is earlier (Step S118), instructs the operator to perform the splicing work in accordance with the determined priority (Step S120), and completes the first work instruction output process.

Figure 7:
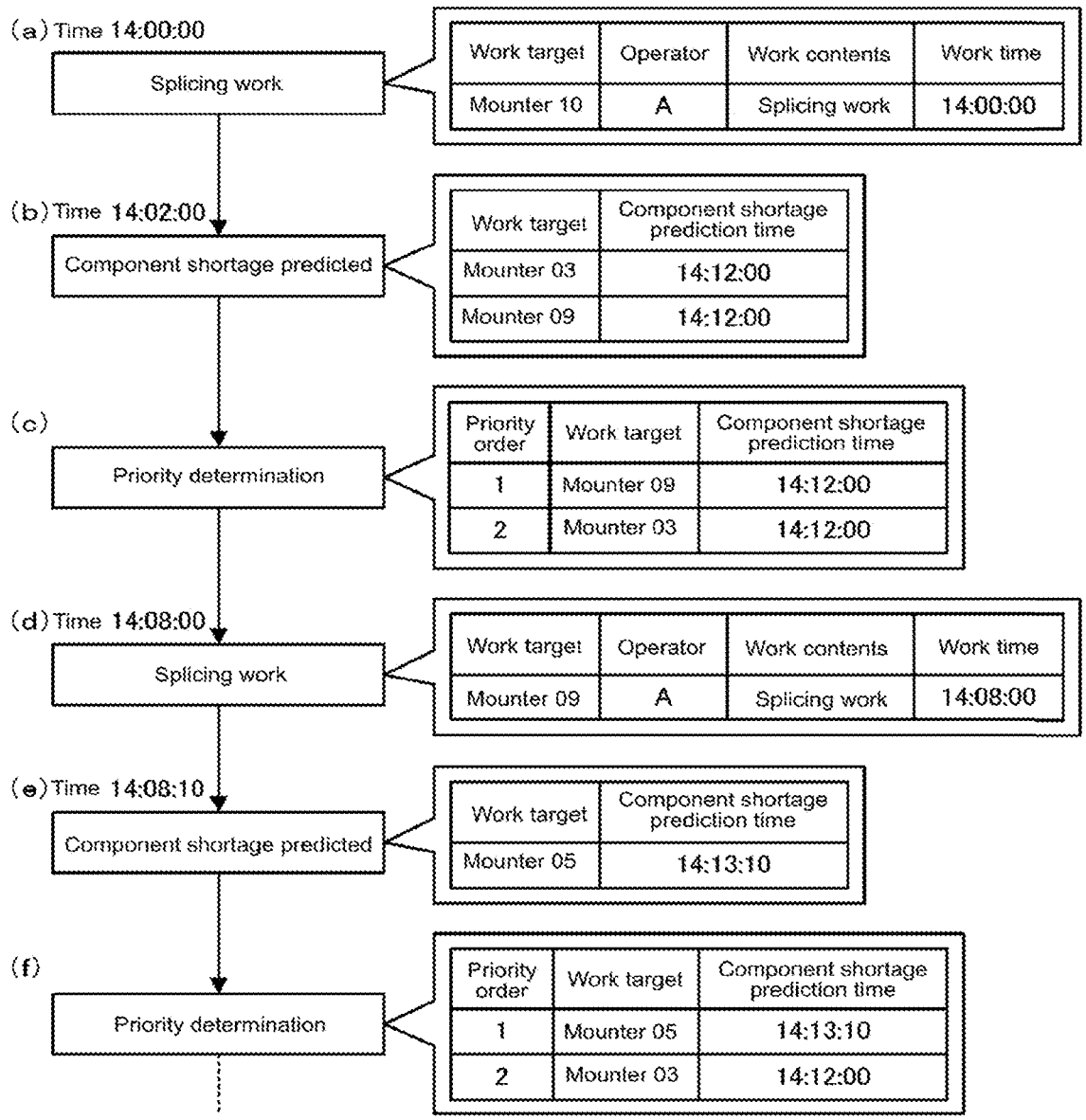
FIG. 7 is a view for describing a flow until instructions for splicing work are issued according to the first work instruction output process.

FIG. 7 is a view for describing a flow until the splicing work instructions are issued according to the first work instruction output process. As illustrated in FIG. 7, the following case is conceivable: at time 14:00:00, operator A completes splicing work using ASU 90 at mounter 10 (refer to FIG. 7(a)); and component shortages are predicted at time 14:02:00 as follows: "mounter 03 splicing work (component shortage prediction time 14:12:00)", "mounter 09 splicing work (component shortage prediction time 14:12:00)" (refer to FIG. 7(b)). In this case, CPU 81 of management device 80 compares the distance from the current position of ASU 90 (mounter 10 using ASU 90 immediately before) to the working position (mounter 03) with the distance from the "current position of ASU 90 (mounter 10 using ASU 90 immediately before) to work position (mounter 09). The splicing work is performed first for a sequence where the distance is shorter, that is, for mounter 09. Thereafter, CPU 81 provisionally determines the priority so that the splicing work is performed at the mounter (refer to FIG. 7(c)). Then, CPU 81 derives the required work time for each of the splicing work in mounter 03 and the splicing work in mounter 09, and determines whether the splicing work can be completed on or before each component shortage prediction time. In this description, even if the work is performed in accordance with the provisionally determined priority, it is determined that both the splicing works can be completed on or before the component shortage prediction time. Therefore, the provisionally determined priority is finally determined. Then, after the operator performs the splicing work in mounter 09 in accordance with the priority at time 14:08:00 (refer to FIG. 7(d)), if a component shortage is predicted as in the "mounter 05 splicing work (component shortage prediction time 14:13:10) at time 14:08:10 (refer to FIG. 7(e)), CPU 81 compares the distance from the current position of ASU 90 (mounter 09 using ASU 90 immediately previously) to the working position (mounter 03) with regard to the mounter 03 which has not completed the splicing work yet, with the distance from the current position of ASU 90 (mounter 09 using ASU 90 immediately previously) to the work position (mounter 05) with regard to the mounter 05 for which a component shortage is newly predicted. The splicing work is performed first for a sequence where the distance is shorter, that is, for mounter 05. Thereafter, CPU 81 determines the priority so that the splicing work is performed at the mounter 03 (refer to FIG. 7(f)). In this way, the priority is determined such that whenever a component shortage is predicted, the splicing work is performed giving priority to, from the multiple work target mounters which have not completed the splicing work yet, the work target mounter for which the distance from ASU 90 is shorter In this manner, it is possible to minimize the movement of ASU 90 when the splicing work is performed for all of the work target mounters. Accordingly, it is possible to quickly and efficiently perform the splicing work.

Figure 8:
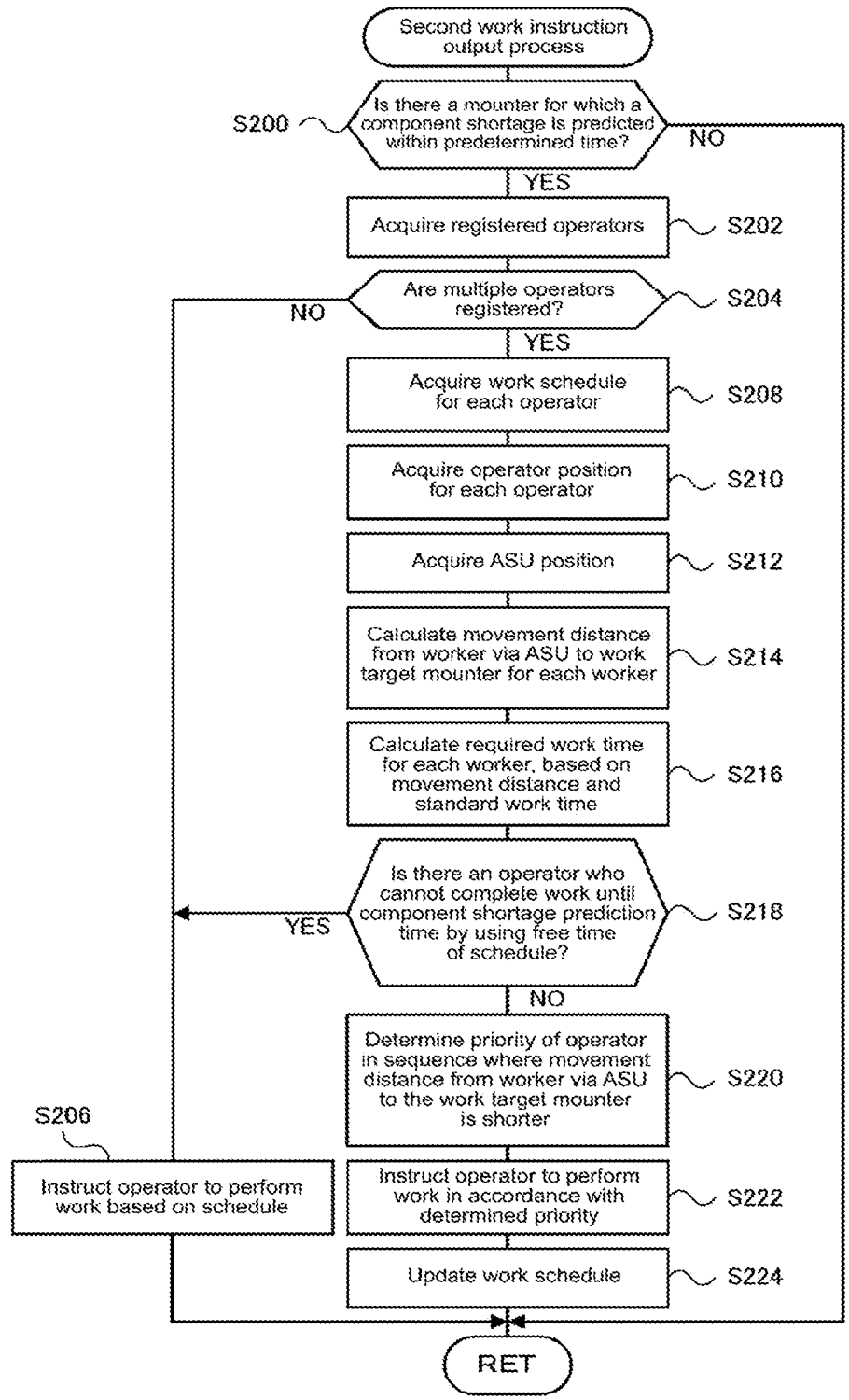
FIG. 8 is a flowchart illustrating an example of a second work instruction output process.
Figures 9, 10:
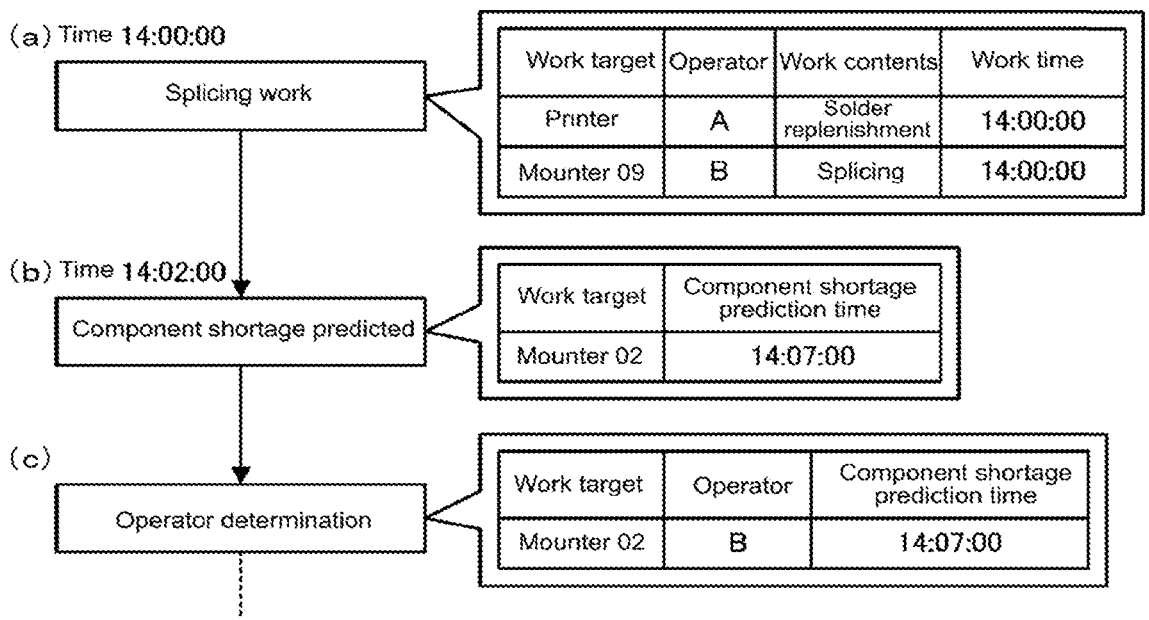
FIG. 9 is a view for describing an example of a work schedule.
FIG. 10 is a view for describing a flow until instructions for splicing work are issued according to the second work instruction output process.

Next, a work instruction output process (second work instruction output process) in a case where multiple workers in charge of one production line perform the work will be described. FIG. 8 is a flowchart illustrating an example of the second work instruction output process performed by CPU 81 of management device 80. The second work instruction output process is performed in each line. As described above, management device 80 registers the operator's ID and the line in charge for each line, and manages the operators in charge of each line and a work schedule of each worker. The work schedule of the operators is a list on which any worker in charge of any work on or before what time is provisionally determined in advance in accordance with the production plan. For example, as illustrated in FIG. 9, pieces of information such as the operator, the work target, the working content, the standard work time, and the component shortage prediction time are correlated with each other therein.

If the second work instruction output process is performed, CPU 81 of management device 80 first determines whether there is a mounter having the mounted feeder 18 in which a component shortage is predicted within a predetermined time (Step S200). If it is determined that there is no mounter having the mounted feeder 18 in which a component shortage is predicted within the predetermined time, CPU 81 completes the work instruction output process without issuing instructions for splicing work. On the other hand, if CPU 81 determines that there is a mounter having the mounted feeder 18 in which a component shortage is predicted within the predetermined time, CPU 81 acquires information (worker's ID) relating to a registered worker allocated to the current line (Step S202), and determines whether multiple workers are registered (Step S204). If CPU 81 determines one worker is registered, CPU 81 instructs the registered worker designated in the work schedule to perform the splicing work (Step S206), and completes the second work instruction output process. In this case, when there are the multiple work target mounters which have to complete the work within the predetermined time, the work may be instructed by determining the priority through the processes in Steps S106 to S120 of the first work instruction output process in FIG. 6. On the other hand, if CPU 81 determines that multiple workers are registered, CPU 81 acquires the work schedule for each worker (Step S208), acquires the current position of each worker (Step S210), and acquires the current position of ASU 90 (Step S212). Here, in the process in Step S210, the current position may be acquired by using a positioning system such as a GPS in a portable information terminal possessed by the operator. Alternatively, a work history of the operator who is in charge whenever the work is performed in the printer or the mounters 1 to 10 may be acquired from each device, and may be stored in HDD 83. In this manner, the current position of the operator may be estimated based on information relating to the device in which the work was performed immediately previously. The process in Step S212 can be performed similarly to the above-described process in Step S106.

If the current position of each worker and the current position of ASU 90 are acquired in this way, based on the acquired current position of each worker, the current position of ASU 90, and the position of the work target mounter, CPU 81 calculates the movement distance until the operator goes and picks up ASU 90 and the movement distance until the operator delivers ASU 90 to the work target mounter, for each worker (Step S214); also, CPU 81 derives the required work time of each worker for the work target mounter (Step S216). Here, as described above, the required work time can be calculated using a sum of the movement time required for the operator to go and pick up ASU 90 and to deliver ASU 90 to the work target mounter and the standard work time (for example, 30 seconds) needed to perform the splicing work at the work target mounter by using ASU 90. The movement time can be calculated using a sum of a time until the operator goes to and picks up ASU 90 and a time until the operator delivers ASU 90 to the work target mounter. The former movement time can be calculated for each worker in such a way that the movement distance from the operator to ASU 90 picked up by the operator is calculated for each worker, based on the current position of the operator which is calculated in Step S210 and the current position of ASU 90 which is acquired in Step S212, and that the movement distance of each worker is divided by the standard movement speed (standard walking speed) of the operator. The latter movement time can be calculated in such a way that the distance from ASU 90 to the work target mounter is calculated based on the position of ASU 90 which is calculated in Step S214 and the position of the predetermined work target mounter, and that the calculated movement distance is divided by the predetermined standard movement speed of ASU 90.

Then, CPU 81 determines whether there is an operator who cannot complete the work on or before the component shortage prediction by using a free time of the work schedule for each worker which is acquired in Step S208, from the multiple registered workers (Step S218). If CPU 81 determines that there is an operator who cannot complete the work before the component shortage prediction time, CPU 81 instructs the operator designated in the work schedule to perform the work (Step S206), and completes the second work instruction output process. On the other hand, if CPU 81 determines that there is no worker who cannot complete the work, CPU 81 determines the priority so that the work is performed giving priority to the operator for whom the movement distance is shorter from the current position of the operator which is calculated in Step S214, via the current position of ASU 90 to the work target mounter, from the multiple registered workers (Step S220). In accordance with the determined priority, CPU 81 instructs the operator to perform the work (Step S222), updates the work schedule (Step S224), and completes the second work instruction output process. For example, the process in Step S220 can be performed by notifying the work priority, the working position (mounter number), or the working content (splicing work) on display 89, or by notifying the information through the portable information terminal possessed by the operator. The work priority includes which worker has to perform the work and where ASU 90 is currently located. The process in Step S224 represents a process for replacing the operator designated in the work schedule for the work relating to the instruction with the operator who has the highest priority determined in Step S220.

FIG. 10 is a view for describing a flow until the splicing work instructions are issued according to the second work instruction output process. As illustrated in FIG. 10, the following case is conceivable: as operators in charge of the production line, operator A and operator B are registered; at time 14:00:00, operator A completes solder replenishment work in the printer (screen printer 2), and operator B completes the splicing work in mounter 09 (refer to FIG. 10(a)); at time 14:02:00, a component shortage is predicted as follows: "mounter 02 splicing work (component shortage prediction time 14:07:00)" (refer to FIG. 10(b)). In a case where operator A is located at the printer and operator B is located at the mounter 02, CPU 81 of the management device 80 compares the distance "from the current position of operator A (printer) via the current position of ASU 90 (mounter 09) to the work target mounter (mounter 02)" with the distance "from the current position of operator B (mounter 09) via the current position of ASU 90 (mounter 09) to the work target mounter (mounter 02)", and derives the required work time for each worker. Next, CPU 81 determines whether there is an operator who cannot complete the work on or before the component shortage prediction time of the mounter 02. In this description, it is determined that both the operators can complete the work on or before the component shortage prediction time of mounter 02. Therefore, CPU 81 determines the shorter distance, that is, instructs operator B to perform the splicing work at mounter 02 (refer to FIG. 10(c)). CPU 81 updates the work schedule based on newly determined content. If component shortages are predicted in this way, CPU 81 issues work instructions giving priority to the operator for which the movement distance is shorter from the operator via ASU 90 to the work target mounter from the multiple registered workers. In this manner, it is possible to minimize the movement until the operator goes and picks up ASU 90. Accordingly, it is possible to efficiently perform the splicing work.

Figure 11:
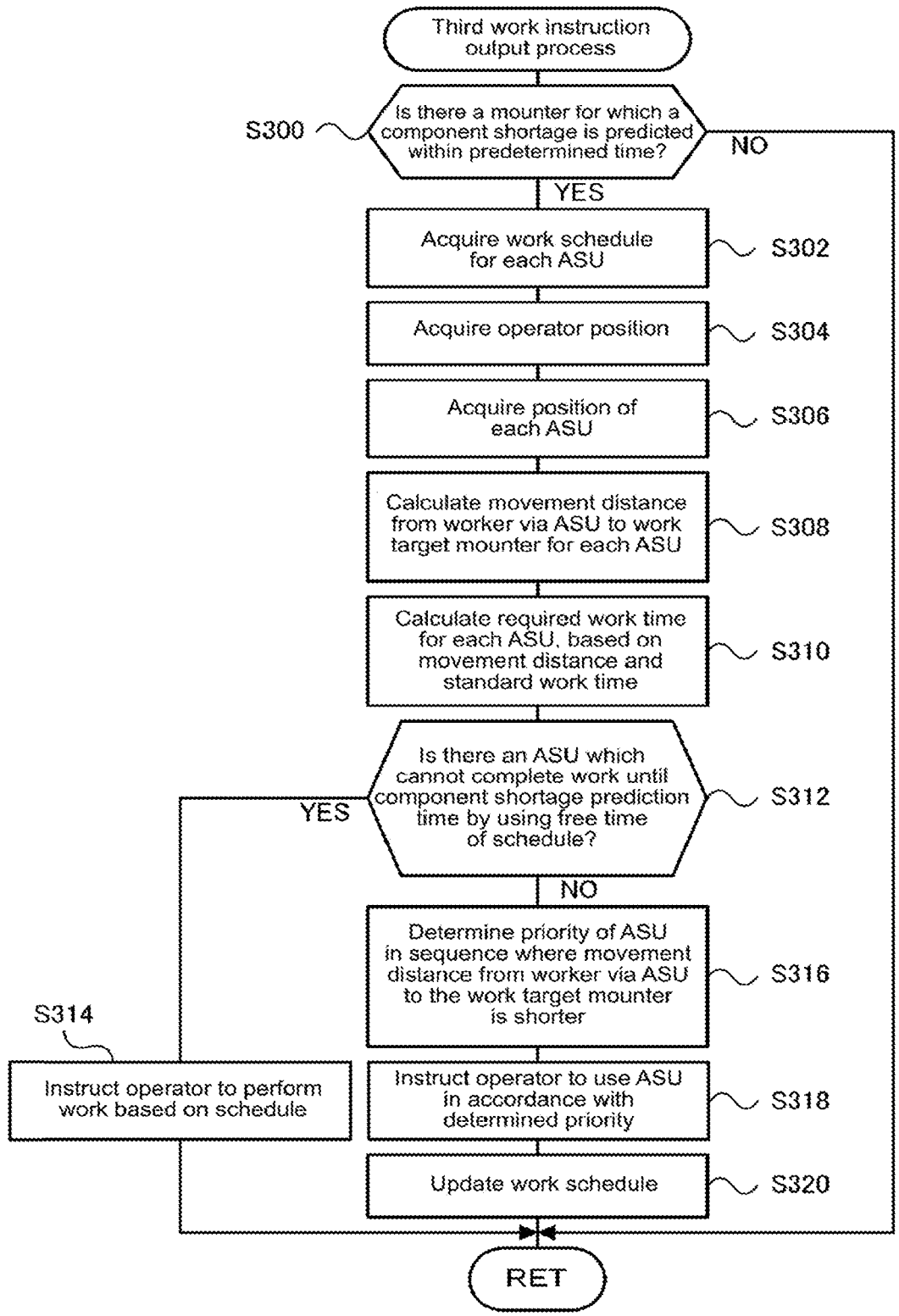
FIG. 11 is a flowchart illustrating an example of a third work instruction output process.

Next, a work instruction output process (third work instruction output process) in a case where ASU 90 is allocated at multiple locations in one production line will be described. FIG. 11 is a flowchart illustrating an example of the third work instruction output process performed by CPU 81 of management device 80. The third work instruction output process is performed in each line. As described above, management device 80 registers the operator's ID and the line in charge for each line, and manages operators in charge of each line and a work schedule of each worker. In addition, management device 80 registers an ASU's ID for each line (identification information of the ASU 90) and a line in charge, and also manages ASUs 90 in charge of each line and the work schedule for each ASU 90. The identification information of the ASU 90 (ASU's ID) may be information inherent to each ASU 90, but this is not essential. The identification information may be information (number or name) by which the multiple ASUs 90 used inside the same line can be distinguished from each other inside the same line. In addition, the work schedule of the ASUs 90 is a list determined in advance of which ASU 90 is in charge of work at which mounter until what time.

If the third work instruction output process is performed, CPU 81 of management device 80 determines whether there is a mounter having the mounted feeder 18 for which a component shortage is predicted within a predetermined time (Step S300). If CPU 81 determines that there is no mounter having the mounted feeder 18 in which a component shortage is predicted within the predetermined time, CPU 81 completes the work instruction output process without issuing splicing work instructions. On the other hand, if CPU 81 determines that there is a mounter having the mounted feeder 18 in which a component shortage is predicted within the predetermined time, CPU 81 acquires the work schedule for each ASU 90 (Step S302), acquires the current position of the operator similarly to Step S210 in the second work instruction output process (Step S304), and acquires the current position of each ASU 90 similarly to Step S212 (Step S306).

If the current position of each worker and the current position of the ASUs 90 are acquired in this way, based on the acquired current position of the operator, the current position of each ASU 90, and the position of the work target mounter, CPU 81 calculates the movement distance until the operator goes and picks up the ASU 90 and the movement distance until the ASU 90 is delivered to the work target, for each ASU 90 (Step S308). CPU 81 derives the required work time of each ASU 90 for the work target mounter (Step S310). Here, the process in Steps S308 and S310 can be performed similarly to Steps S214 and S216 in the above-described second work instruction output process.

Then, CPU 81 determines whether there is an ASU 90 which cannot complete the work on or before the component shortage prediction time by using the free time of the work schedule of each ASU 90 which is obtained in Step S302, in the multiple ASUs 90 in charge of a processing target line (Step S312). If CPU 81 determines that there is an ASU 90 which cannot complete the work, CPU 81 instructs the operator to perform the work using the ASU 90 designated in the work schedule (Step S314), and completes the third work instruction output process. On the other hand, if CPU 81 determines that there is no ASU 90 which cannot complete the work, CPU 81 determines that when in use priority is given to the ASU 90 for which the movement distance from the operator via the ASU 90 to the work target mounter which is calculated in Step S308 is shorter, from the multiple ASUs 90 in charge (Step S316). CPU 81 instructs the operator to perform the work using the ASU 90 in accordance with the determined priority (Step S318), updates the work schedule of the ASU 90 (Step S320), and completes the third work instruction output process. For example, the process in Step S318 can be performed by notifying the work priority, the working position (mounter number), or the working content (splicing work) on display 89, or by notifying the information via the portable information terminal possessed by the operator. The work priority includes which worker has to perform the work using any ASU 90 and where the ASU 90 is currently located. An ID mark is provided for each ASU 90, or a number such as ASU 1 is provided for each ASU 90. In this manner, it is desirable that the ASU 90 has a display which can visibly identify which ASU 90 is used by an operator. The process in Step S320 represents a process for replacing the ASU 90 designated in the work schedule for the work relating to the instruction with the ASU 90 which has the highest priority determined in Step S316. In the third work instruction output process, in a case where multiple workers in charge of the processing target line are present, CPU 81 performs the processes in Steps S308 to S312 for each worker. In Steps S316 and S318, CPU 81 determines that the priority is given to a combination of the operator and the ASU 90 for which the distance from the operator via the ASU 90 to the work target mounter is shorter, and instructs the operator to perform the splicing work.

Figure 12:
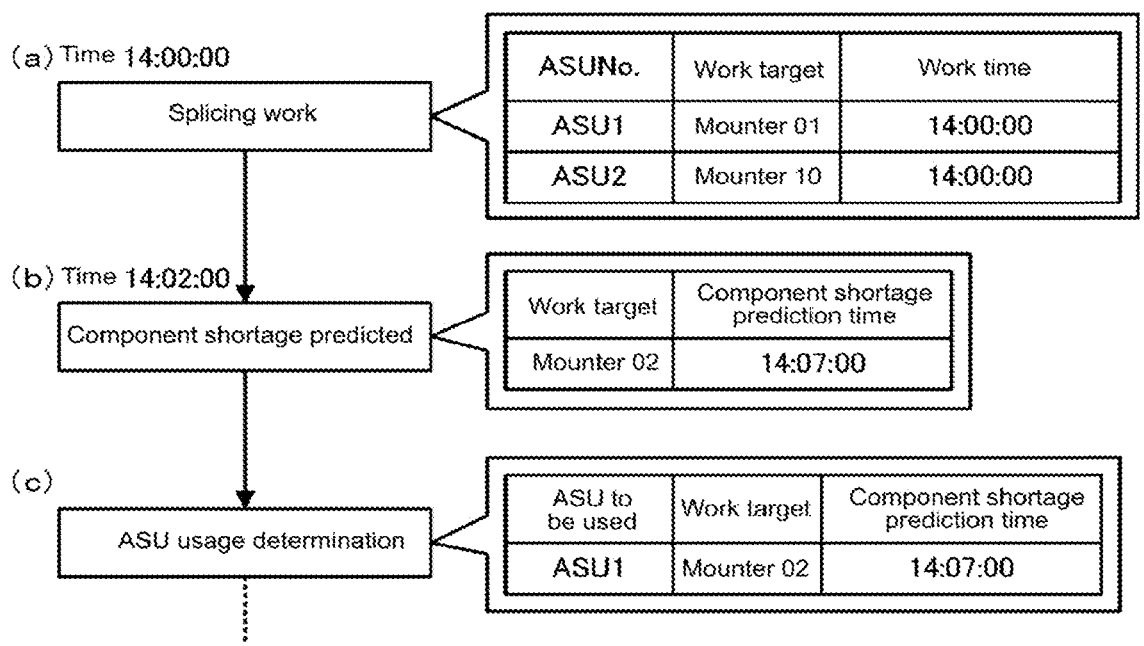
FIG. 12 is a view for describing a flow until instructions for splicing work are issued according to the third work instruction output process.

FIG. 12 is a view for describing a flow until the splicing work is instructed according to the third work instruction output process. The following case is conceivable where: as operators in charge of the production line, operator A and operator B are registered; as ASUs 90 in charge of the production line, ASU 1 and ASU 2 are registered; at time 14:00:00, operator A completes the splicing work at mounter 01 using ASU 1, and operator B completes the splicing work at mounter 10 using ASU 2 (refer to FIG. 12(*a*)); at time 14:02:00, a component shortage is predicted as follows: "mounter 02 splicing work (component shortage prediction time 14:07:00)" (refer to FIG. 12(*b*)). In this case, CPU 81 of management device 80 compares the distance "from the current position of operator A (mounter 01) via the current position of ASU 1 (mounter 01) to the work target mounter (mounter 02)" with the distance "from the current position of operator B (mounter 10) via the current position of ASU 2 (mounter 10) to the work target mounter (mounter 02), and derives the required work time of each ASU 90. Next, CPU 81 determines whether there is an ASU 90 which cannot complete the work on or before the component shortage prediction time of mounter 02. In this description, it is determined that both the ASUs 90 can complete the work on or before the component shortage prediction time of mounter 02. Therefore, CPU 81 determines the shorter distance, that is, instructs operator A to perform the splicing work using ASU 1 (refer to FIG. 12(*c*)). CPU 81 updates the work schedule based on newly determined content. If component shortages are predicted in this way, CPU 81 issues work instructions so as to give priority to the ASU 90 for which the movement distance from the operator via the ASU 90 to the work target mounter is shorter from the multiple registered ASUs 90. In this manner, it is possible to efficiently carry out the splicing work considering the movement distance of the ASU 90.

According to the above-described management device 80 of the present embodiment, in the first work instruction output process, the priority is determined so that whenever a component shortage is predicted, the splicing work is performed giving priority to, from the multiple work target mounters which have not completed the splicing work yet, the mounter for which the distance from the ASU 90 is shorter. Accordingly, it is possible to minimize the movement of the ASU 90 when the splicing work is performed for all of the work target mounters, and it is possible to quickly and efficiently perform the splicing work.

In addition, according to management device 80 of the present embodiment, in the second work instruction output process, in a case where the multiple workers in charge of one production line are registered, if a component shortage is predicted, work instructions are issued so as to give priority to the operator, from the multiple registered workers, for which the movement distance from the operator via the ASU 90 to the work target mounter is shorter. Accordingly, it is possible to minimize the movement as the operator goes and picks up the ASU 90. Therefore, it is possible to efficiently perform the splicing work.

Furthermore, according to management device 80 of the present embodiment, in the third work instruction output process, in a case where the ASU 90 allocated to one production line is disposed at multiple locations, if a component shortage is predicted, work instructions are issued giving priority to, from the multiple registered ASUs 90, the ASU 90 for which the movement distance from the operator via the ASU 90 to the work target mounter is shorter. Accordingly, it is possible to minimize the movement distance of the ASU 90. Therefore, it is possible to efficiently perform the splicing work.

Figure 13:
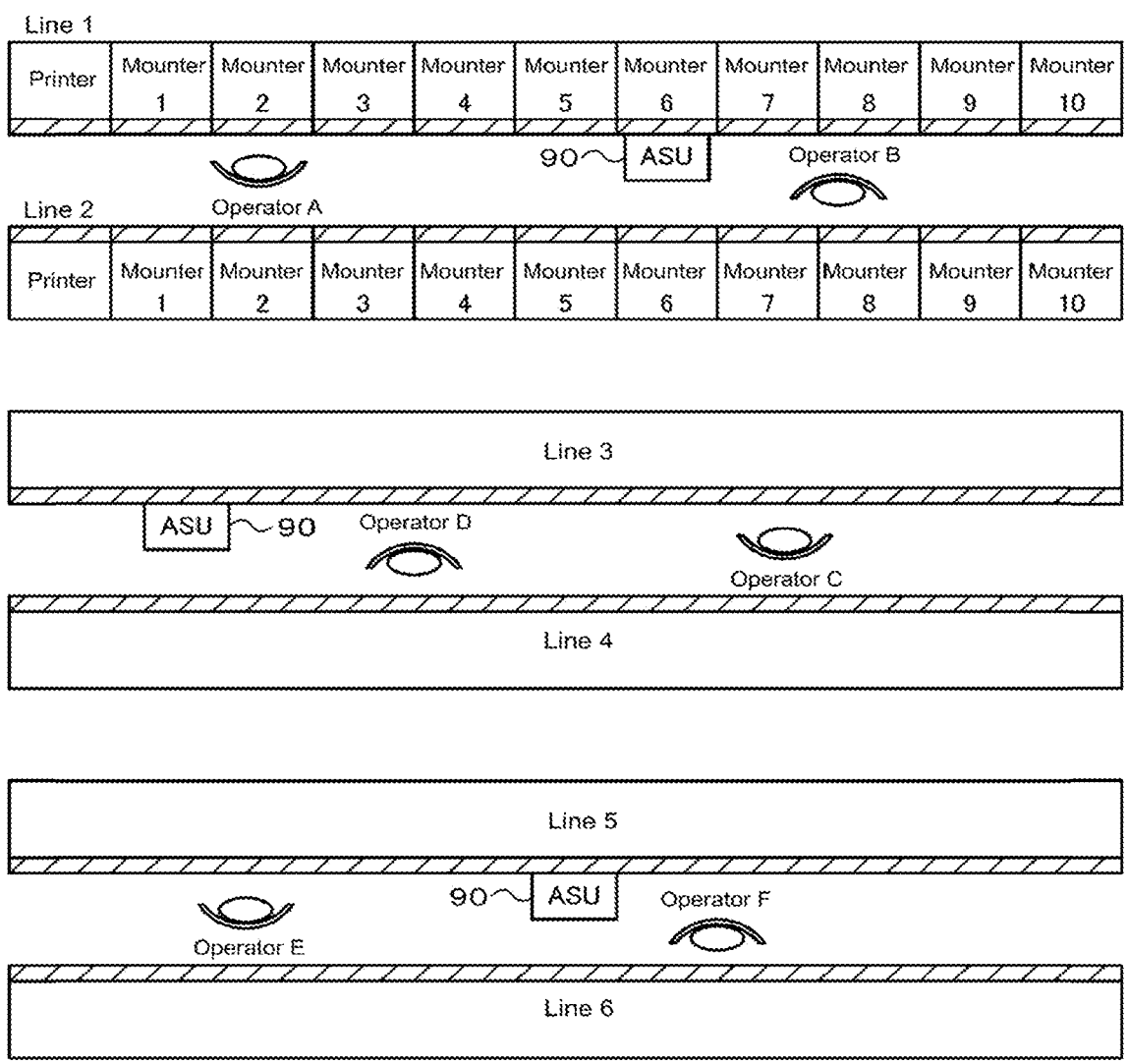
FIG. 13 is a view for describing a production line according to an alternative embodiment.

In component mounting system 1 according to the present embodiment, one or multiple ASUs 90 are allocated to one line, but a configuration is not limited thereto. One or multiple ASUs 90 may be used in common for multiple lines. For example, as illustrated in FIG. 13, one ASU 90 may be used in common for two lines by installing each mounter of two adjacent lines in the multiple production lines so that the component supply device 16 sides (hatched portions) face each other. In this case, the movement distance of the ASU 90 may be determined by considering only the distance in the longitudinal direction (lateral direction in FIG. 13) of the line without considering the distance in the short direction (vertical direction in FIG. 13) of the line. For example, in a case where operator A located in the vicinity of mounter 10 of line 1 goes and picks up the ASU 90 located at mounter 05 of line 2, delivers the ASU 90 to mounter 01 of line 1 which serves as the work target mounter, and performs the splicing work at the work target mounter, the movement distance from mounter 10 of line 1 to mounter 01 of line 1 via mounter 05 of line 2 along the longitudinal direction of the line may be calculated.

Figure 14:
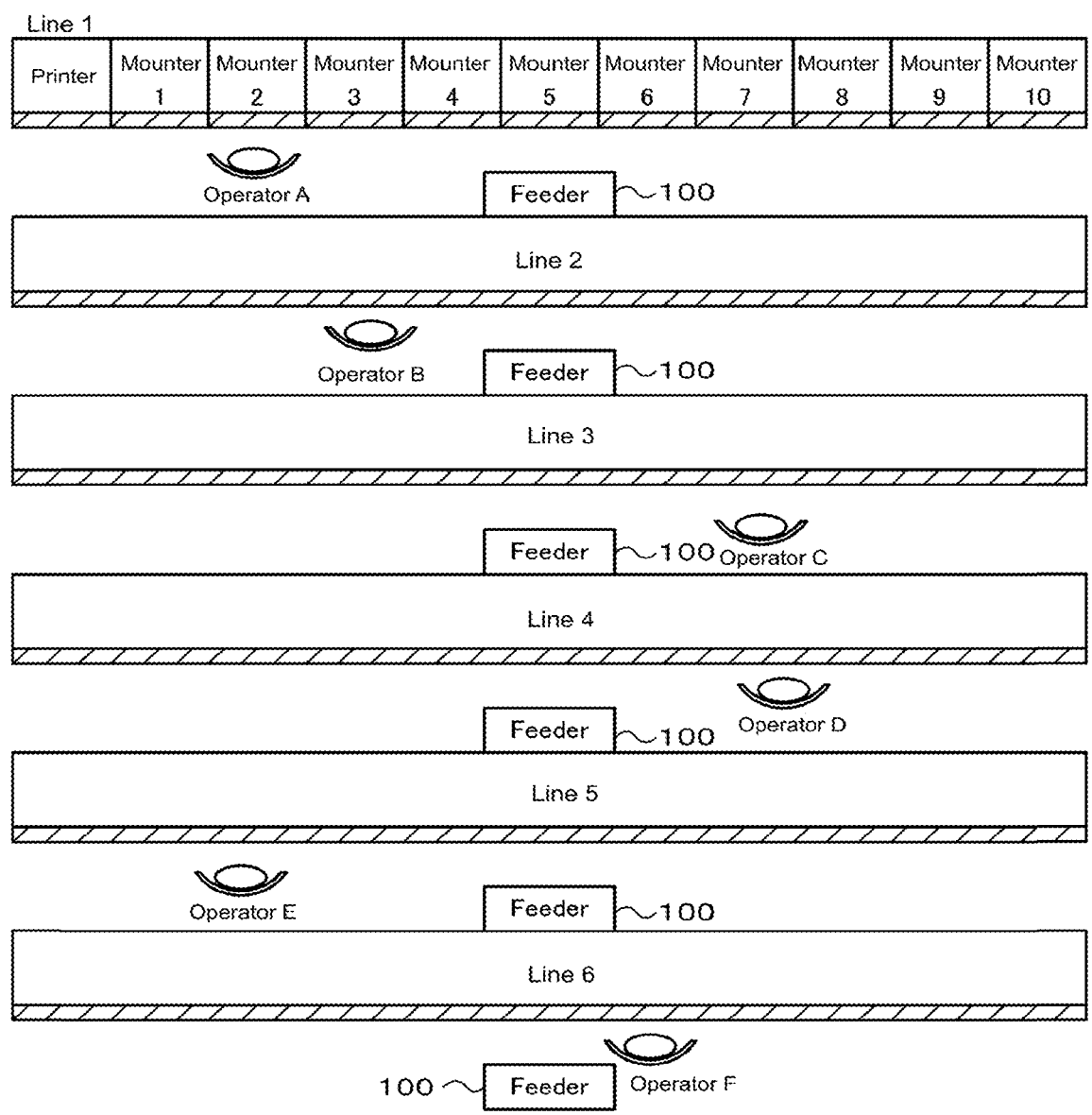
FIG. 14 is a view for describing a production line according to an alternative embodiment.
Figure 15:
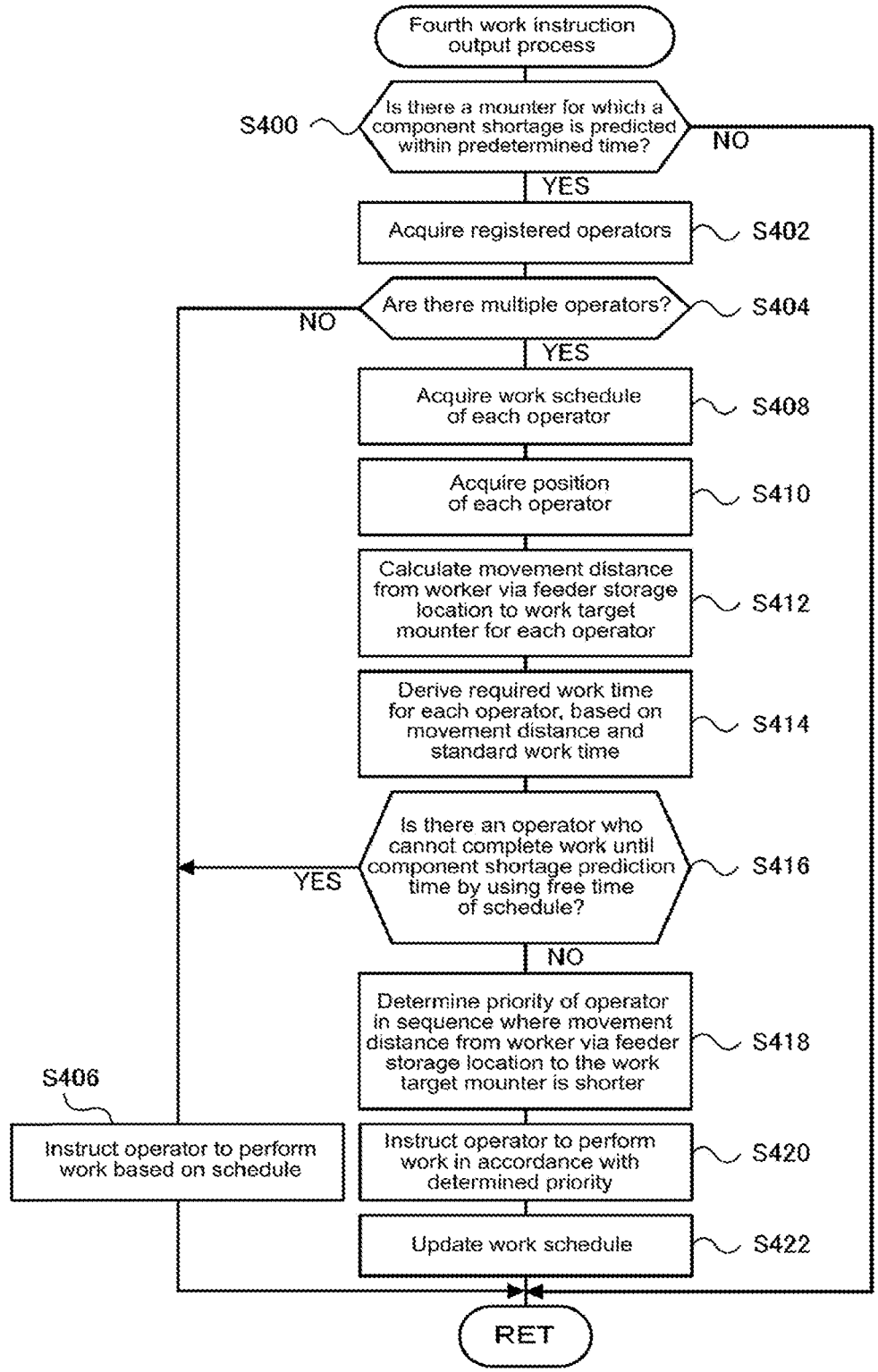
FIG. 15 is a flowchart illustrating an example of a fourth work instruction output process.

In the above-described embodiment, description is made so that the disclosure is applied to the splicing work using the ASU 90, but a configuration is not limited thereto. For example, as illustrated in FIG. 14, the disclosure may be employed to the following case. A feeder storage location 100 for installing a spare feeder 18 in the production line is disposed at predetermined locations (for example, a central position) of the line. The operator goes to feeder storage location 100 and picks up feeder 18. The operator delivers the feeder 18 to the work target mounter, and performs exchange work of the feeder 18 for the work target mounter. FIG. 15 is a flowchart illustrating an example of a fourth work instruction output process performed by CPU 81 of management device 80. The fourth work instruction output process is performed in each line. As described above, management device 80 registers the operator's ID and the line in charge for each line, and manages the operators in charge of each line and a work schedule of each worker.

If the fourth work instruction output process is performed, CPU 81 of management device 80 determines whether there is a mounter having the mounted feeder 18 for which a component shortage is predicted within a predetermined time (Step S400). If CPU 81 determines that there is no mounter having the mounted feeder 18 for which a component shortage is predicted within the predetermined time, CPU 81 completes the work instruction output process without issuing a feeder exchange instruction. On the other hand, if CPU 81 determines that there is a mounter having the mounted feeder 18 in which the component shortage is predicted within the predetermined time, CPU 81 acquires information (worker's ID) relating to the registered worker allocated to the current line (Step S402), and determines whether the multiple workers are registered (Step S404). If CPU 81 determines that there is one registered worker, CPU 81 instructs the registered worker designated in the work schedule to perform feeder exchange (Step S406), and completes the fourth work instruction output process. On the other hand, if the CPU 81 determines that multiple workers are registered, the CPU 81 acquires the work schedule of each worker (Step S408), and acquires the current position of each worker (Step S410). The process in Step S410 can be performed similarly to the process in Step S210.

If the current position of each worker is acquired in this way, based on the acquired current position of each worker, the position of feeder storage location 100, and the position of the work target mounter, CPU 81 calculates the movement distance until the operator goes and picks up the spare feeder 18 accommodated in feeder storage location 100 and the movement distance until the operator delivers the feeder 18 of feeder storage location 100 to the work target mounter, for each worker (Step S412). CPU 81 derives the required work time of each worker for the work target mounter (Step S414). Here, the required work time of each worker can be calculated using a sum of the movement time required for the operator to go to feeder storage location 100, to pick up the feeder 18, and to deliver the feeder 18 to the work target mounter and the standard work time (for example, 30 seconds) needed to perform the exchange work of the feeder 18 at the work target mounter. The movement time can be calculated using a sum of the time until the operator goes to feeder storage location 100 and picks up the feeder 18 and the time for delivering the feeder 18 from feeder storage location 100 to the work target mounter. The former movement time can be calculated for each worker in such a way that the movement distance until the operator the operator goes to the feeder storage location 100 and picks up the feeder 18 is calculated for each worker, based on the current position of the operator which is calculated in Step S410 and the predetermined position (central position of the line) of feeder storage location 100, and the calculated movement distance is divided by the standard movement speed (standard walking speed) of the operator. The latter movement time can be calculated in such a way that the movement distance from feeder storage location 100 to the work target mounter which is calculated in Step S412 is divided by the standard movement speed of the operator when the operator delivers the feeder 18.

Then, CPU 81 determines whether here is an operator who cannot complete the work on or before the component shortage prediction time by using the free time of the work schedule of each worker which is acquired in Step S408, from the multiple registered workers (Step S416). If CPU 81 determines that there is an operator who cannot complete the work, CPU 81 instructs the operator designated in the work schedule to perform the work (Step S406), and completes the fourth work instruction output process. On the other hand, if CPU 81 determines that there is no worker who cannot complete the work, CPU 81 determines the priority so that the work is performed by giving priority to the operator for which the movement distance from the operator via the feeder storage location 100 to the work target mounter which is calculated in Step S412 is shortest, from the multiple registered workers (Step S418). CPU 81 instructs the operator to perform the work in accordance with the determined priority (Step S420), updates the work schedule (Step S422), and completes the fourth work instruction output process. For example, the process in Step S420 can be performed by notifying the work priority, the working position (mounter number), or the working content (feeder exchange) on the display 89, or by notifying the information through the portable information terminal possessed by the operator. The work priority includes which worker has to perform the work and where the feeder 18 is currently located. The process in Step S422 represents a process for replacing the operator designated in the work schedule for the work relating to the instruction with the operator who has the highest priority determined in Step S418.

Figure 16:
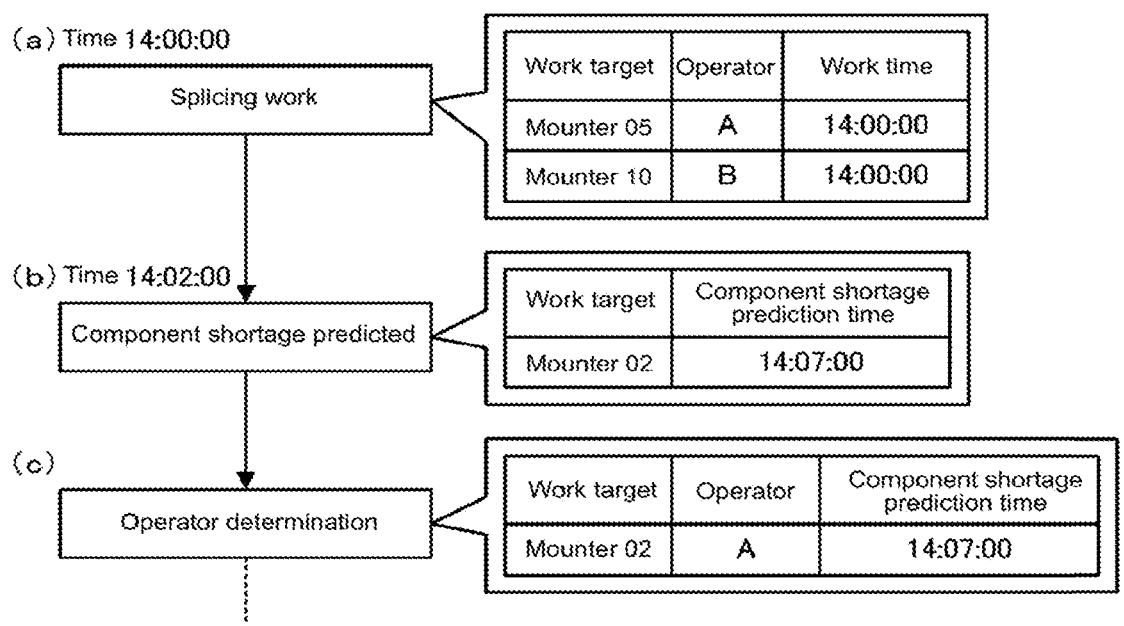
FIG. 16 is a view for describing a flow until instructions for feeder exchange work are issued according to the fourth work instruction output process.

FIG. 16 is a view for describing a flow until the feeder exchange work instructions are issued according to the fourth work instruction output process. As illustrated in FIG. 16, the following case is conceivable where: as operators in charge of the production line, operator A and operator B are registered; at time 14:00:00, operator A completes feeder exchange at mounter 05, and operator B completes feeder exchange at mounter 10 (refer to FIG. 16(*a*)); at time 14:02:00, a component shortage is predicted as follows: "mounter 02 feeder exchange (component shortage prediction time 14:07:00)" (refer to FIG. 16(*b*)). In this case, CPU 81 of management device 80 compares the distance "from the current position of operator A (mounter 05) via the position of feeder storage location 100 (central position of the line, vicinity of the mounter 05) to the work target mounter (mounter 02)" with the distance "from the current position of operator B (mounter 10) via the position of feeder storage location 100 (central position of the line, vicinity of the mounter 05) to the work target mounter (mounter 02)", and derives the required work time for each worker. Next, CPU 81 determines whether there is an operator who cannot complete the work on or before the component shortage prediction time of the mounter 02. In this description, it is determined that both the operators can complete the work on or before the component shortage prediction time of the mounter 02. Therefore, CPU 81 determines the shorter distance, that is, instructs operator A to perform the feeder exchange work at the mounter 02 (refer to FIG. 16(*c*)). The CPU 81 updates the work schedule, based on newly determined content. If component shortages are predicted in this way, the CPU 81 issues work instructions so as to give priority to the operator for which the movement distance from the operator via feeder storage location 100 to the work target mounter is shorter from the multiple registered workers. In this manner, in view of the movement distance when the operator goes and picks up the feeder 18 from feeder storage location 100, it is possible to efficiently perform the feeder exchange.

According to the above-described embodiment, as the position of the work target, the position of the mounter for the work target is considered. However, an installation position of the feeder installed on the mounter for the work target may be the position of the work target. For example, in one mounter in which the component supply device is long in the longitudinal direction of the line, in a case where there are multiple feeders in which the component shortage is predicted, an efficient work sequence can be determined, based on the mounting position of the work target feeder.

According to the above-described embodiment, in the first work instruction output process, in a case where it is provisionally determined that the splicing work is performed in accordance with the provisionally determined priority, if it is determined that the work cannot be completed on or before the component shortage prediction time for any one of the multiple splicing works, the priority is determined so that the work is performed by giving priority to the splicing work for which the component shortage prediction is earlier. However, the work may be performed by giving the priority to the splicing work in which the work cannot be completed on or before the component shortage prediction time. In this manner, the priority may be determined so that the provisionally determined priority is applied to only the splicing work in which the work can be completed on or before the component shortage prediction time.

According to the above-described embodiment, in the second work instruction output process or the fourth work instruction output process, if it is determined that there is an operator who cannot complete the work on or before the component shortage prediction time by using the free time of the schedule, the operator designated in the work schedule is instructed to perform the work. However, the priority of operators may be determined for only the operator who can complete the work on or before the component shortage prediction time by using the free time of the schedule, based on the movement distance from the operator via ASU 90 to the work target mounter or the movement distance from the operator via feeder storage location 100 to the work target mounter. In this manner, the determined worker may be instructed to perform the work.

According to the above-described embodiment, in the third work instruction output process, if it is determined that there is an ASU 90 which cannot complete the work before the component shortage prediction time by using the free time of the work schedule of each ASU 90, the operator is instructed to perform the work using the ASU 90 designated in the work schedule. However, the priority of ASUs 90 may be determined for only the ASU 90 which can complete the work on or before the component shortage prediction time by using the free time of the work schedule, based on the movement distance from the operator via the ASU 90 to the work target mounter. In this manner, the operator may be instructed to perform the work using the determined ASU 90.

Here, a correspondence relationship between main elements according to the present embodiment and main elements according to the disclosure disclosed in the summary of the disclosure will be described. That is, screen printer 2 and component mounting machine 10 correspond to a "board processing machine". CPU 81 of management device 80 which performs the process in Step S100 of the first work instruction output process in FIG. 6, the process in Step S200 of the second work instruction output process in FIG. 8, and the process in Step S300 of the third work instruction output process in FIG. 11 corresponds to a "work information acquisition device". CPU 81 of management device 80 which performs the process in Step S106 of the first work instruction output process, the processes in Steps S210 and S212 of the second work instruction output process, and the processes in Steps S304 and S306 of the third work instruction output process corresponds to a "position acquisition device". CPU 81 of management device 80 which performs the processes in Steps S108 to S118 of the first work instruction output process, the processes in Steps S214 to S220 of the second work instruction output process, and the processes in Steps S308 to S316 of the third work instruction output process corresponds to a "work sequence determination device". CPU 81 of management device 80 which performs the process in Step S120 of the first work instruction output process, the process in Step S222 of the second work instruction output process, and the process in Step S318 of the third work instruction output process corresponds to a "work instruction device". In addition, RAM 84 of management device 80 corresponds to a "storage device". In addition, CPU 81 of management device 80 which performs the process in Step S400 of the fourth work instruction output process in FIG. 15 corresponds to a "work information acquisition device". CPU 81 of management device 80 which performs the process in Step S410 of the fourth work instruction output process corresponds to a "position acquisition device". CPU 81 of management device 80 which performs the processes in Steps S412 to S418 of the fourth work instruction output process corresponds to a "operator determination device". CPU 81 of the management device 80 which performs the process in Step S420 of the fourth work instruction output process corresponds to a "work instruction device".

The disclosure is not limited to the above-described embodiments, and can be performed in various forms which are included within the technical scope of the disclosure, as a matter of course.

INDUSTRIAL APPLICABILITY

The disclosure can be utilized for manufacturing industries of a board processing machine or a management device.

REFERENCE SIGNS LIST

1: component mounting system, 2: screen printer, 10: component mounting machine, 11: base, 12: main body frame, 13: support table, 14: feeder table, 16: component supply device, 18: feeder, 20: board conveyance device, 22: belt conveyor device, 30: backup device, 32: backup plate, 34: backup pin, 40: XY robot, 41: X-axis guide rail, 42: X-axis slider, 42a: X-axis position sensor, 42b: X-axis actuator, 43: Y-axis guide rail, 44: Y-axis slider, 44a: Y-axis position sensor, 44b: Y-axis actuator, 46: mark camera, 48: component camera, 49: nozzle station, 50: head, 51: suction nozzle, 52: Z-axis actuator, 54: θ-axis actuator, 60: card reader, 70: control device, 71: CPU, 72: ROM, 73: HDD, 74: RAM, 75: input and output interface, 76: bus, 80: management device, 81: CPU, 82: ROM, 83: HDD, 84: RAM, 85: input and output interface, 86: bus, 87: input device, 88: card reader, 89: display, 90: automatic splicing unit (ASU), 92,94: feeding groove

The invention claimed is:

1. A management device that manages a predetermined work to be performed by a predetermined work machine under the control of a single operator for multiple board processing machines which perform a predetermined process on a circuit board, comprising:
at least one processor configured to:
store a production plan including the predetermined process;
cause at least one of the multiple board processing machines to mount a component on the circuit board in accordance with the production plan;
identify a plurality of the multiple board processing machines as a plurality of target board processing machines when the plurality of the multiple board processing machines are predicted to have a component shortage within a predetermined time;
identify one of the multiple board processing machines as a target board processing machine when only the one of the multiple board processing machines is predicted to have a component shortage within the predetermined time;
when the plurality of the multiple board processing machines are identified as the plurality of target board processing machines, perform a first process including:
acquire from each of the plurality of target board processing machines a work timing by which the predetermined work performed by the predetermined work machine is required to be completed for the target board processing machine, as work information;
acquire a current position of the predetermined work machine, the predetermined work machine being movable with respect to the multiple board processing machines, being distinct from the multiple board processing machines, and interacting with the plurality of target board processing machines when the predetermined work is performed by the single operator using the predetermined work machine, the current position of the predetermined work machine corresponding to a position of a board processing machine of the multiple board processing machines at which the predetermined work machine previously performed the predetermined work;
determine a work sequence for the plurality of target board processing machines based on the current position of the predetermined work machine such that the predetermined work can be performed by the single operator before elapse of the work timings respectively corresponding to the plurality of target board processing machines; and
instruct the single operator to perform the predetermined work for each of the plurality of target board processing machines using the predetermined work machine based on the determined work sequence; and
when the one of the multiple board processing machines is identified as the target board processing machine, perform a second process different from the first process including:
instruct the single operator to perform the predetermined work for the target board processing machine using the predetermined work machine.

2. The management device according to claim 1, wherein the at least one processor is configured to determine the work sequence so that the predetermined work is performed giving priority to, from among the plurality of target board processing machines, one of the plurality of target board processing machines closest to the current position of the predetermined work machine.

3. The management device according to claim 1, wherein the at least one processor is configured to:
store a work history for the multiple board processing machines, and
estimate the current position of the predetermined work machine by acquiring information relating to the board processing machine at which the predetermined work machine previously performed the predetermined work based on the stored work history.

4. The management device according to claim 1, wherein the at least one processor is configured to:
acquire a current position of the single operator, and
determine the work sequence so that the predetermined work is performed giving priority to, from among the plurality of target board processing machines, one of the plurality of target board processing machines for which a sum of a distance from the current position of the single operator to the current position of the predetermined work machine and a distance from the current position of the predetermined work machine to a position of said one of the plurality of target board processing machines is smaller.

5. The management device according to claim 1, wherein multiple of the predetermined work machines are provided, and
the at least one processor is configured to:
acquire the current position of each of the multiple predetermined work machines, and
determine the work sequence based on the current position of, from the multiple predetermined work machines, one of the predetermined work machines in which a distance to one of the plurality of target board processing machines is shortest.

6. The management device according to claim 2, wherein the at least one processor is configured to:
determine whether the predetermined work can be performed for each of the plurality of target board processing machines before elapse of the work timings respectively corresponding to the plurality of target board processing machines using the work sequence giving priority to the target board processing machine of the plurality of target board processing machines closest to the current position of the predetermined work machine based upon a required work time for performing the predetermined work for each of the plurality of target board processing machines, and
when the predetermined work cannot be performed for each of the plurality of target board processing machines before elapse of the work timings respectively corresponding to the plurality of target board processing machines using the work sequence giving priority to the target board processing machine closest to the current position of the predetermined work machine, determine the work sequence so that the predetermined work is performed giving priority to, from the plurality of target board processing machines, one of the plurality of target board processing machines whose work period is shortest.

7. The management device according to claim 6, wherein the required work time includes a sum of (1) a movement time during which the single operator goes to, picks up, and delivers the predetermined work machine to said one target board processing machine of the plurality of target board processing machines, and (2) a standard work time.

8. The management device according to claim 1, wherein the predetermined work machine includes a splicing device, and
the predetermined work includes joining a leading end of a first component tape with a tail end of a second component tape.

9. The management device according to claim 1, wherein the predetermined work machine includes a feeder, and
the predetermined work includes exchanging the feeder.

10. The management device according to claim 1, wherein the work timing is associated with a time until the component shortage.

11. The management device according to claim 10, wherein the at least one processor is configured to determine whether any of the multiple board processing machines will experience the component shortage.

12. The management device according to claim 10, wherein said acquiring the work timing includes determining the time until the component shortage.

13. A system comprising:
a management device that manages a predetermined work to be performed by a predetermined work machine under the control of a single operator for multiple board processing machines which perform a predetermined process on a circuit board, including:
at least one processor configured to:
store a production plan including the predetermined process;
identify a plurality of the multiple board processing machines as a plurality of target board processing machines when the plurality of the multiple board processing machinesor are predicted to have a component shortage within a predetermined time;
identify one of the multiple board processing machines as a target board processing machine when only the one of the multiple board processing machines is predicted to have a component shortage within the predetermined time;
when the plurality of the multiple board processing machines are identified as the plurality of target board processing machines, perform a first process including:
acquire from each of the plurality of target board processing machines a work timing by which the predetermined work performed by the predetermined work machine is required to be completed for the target board processing machine, as work information;
acquire a current position of the predetermined work machine, the predetermined work machine being movable with respect to the multiple board processing machines, being distinct from the multiple board processing machines, and interacting with the plurality of target board processing machines when the predetermined work is performed by the single operator using the predetermined work machine, the current position of the predetermined work machine corresponding to a position of a board processing machine of the multiple board processing machines at which the predetermined work machine previously performed the predetermined work;
determine a work sequence for the plurality of target board processing machines based on the current position of the predetermined work machine such that the predetermined work can be performed by the single operator before elapse of the work timings respectively corresponding to the plurality of target board processing machines; and
instruct the single operator to perform the predetermined work for each of the plurality of target board processing machines using the predetermined work machine based on the determined work sequence; and
when the one of the multiple board processing machines is identified as the target board processing machine, perform a second process different from the first process including:
instruct the single operator to perform the predetermined work for the target board processing machine using the predetermined work machine;
the multiple board processing machines; and
a screen printer, wherein
the at least one processor is configured to:
cause the screen printer to print a circuit pattern on the circuit board; and cause at least one of the multiple board processing machines to mount a component on the circuit board in accordance with the production plan.

\* \* \* \* \*